(12) United States Patent
Ranjan et al.

(10) Patent No.: US 8,980,649 B2
(45) Date of Patent: Mar. 17, 2015

(54) METHOD FOR MANUFACTURING NON-VOLATILE MAGNETIC MEMORY CELL IN TWO FACILITIES

(71) Applicant: Avalanche Technology, Inc., Fremont, CA (US)

(72) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/028,216

(22) Filed: Sep. 16, 2013

(65) Prior Publication Data

US 2014/0017818 A1  Jan. 16, 2014

Related U.S. Application Data

(63) Continuation of application No. 12/040,827, filed on Feb. 29, 2008, now Pat. No. 8,535,952, which is a continuation-in-part of application No. 11/674,124, filed on Feb. 12, 2007, now Pat. No. 8,084,835, (Continued)

(51) Int. Cl.
| | |
|---|---|
| *H01L 21/00* | (2006.01) |
| *H01L 43/12* | (2006.01) |
| *B82Y 10/00* | (2011.01) |
| *B82Y 25/00* | (2011.01) |
| *G11C 11/16* | (2006.01) |
| *H01L 27/22* | (2006.01) |

(52) U.S. Cl.
CPC ............... *H01L 43/12* (2013.01); *B82Y 10/00* (2013.01); *B82Y 25/00* (2013.01); *G11C 11/16* (2013.01); *H01L 27/228* (2013.01)
USPC .............. 438/3; 257/E21.665; 257/E27.005

(58) Field of Classification Search
CPC ............. H01L 28/55; H01L 27/11502; H01L 27/11507; H01L 43/12; H01L 21/31691
USPC ................. 438/3; 257/E21.665, E27.005
See application file for complete search history.

(56) References Cited

U.S. PATENT DOCUMENTS

| | | | | |
|---|---|---|---|---|
| 6,642,595 | B1 * | 11/2003 | Hung et al. | 257/421 |
| 6,905,578 | B1 * | 6/2005 | Moslehi et al. | 204/192.12 |
| 2005/0105325 | A1 * | 5/2005 | Haneda et al. | 365/154 |

*Primary Examiner* — Andy Huynh
(74) *Attorney, Agent, or Firm* — Maryam Imam; IPxLaw Group LLP

(57) ABSTRACT

In accordance with a method of the present invention, a method of manufacturing a magnetic random access memory (MRAM) cell and a corresponding structure thereof are disclosed to include a multi-stage manufacturing process. The multi-stage manufacturing process includes performing a front end on-line (FEOL) stage to manufacture logic and non-magnetic portions of the memory cell by forming an intermediate interlayer dielectric (ILD) layer, forming intermediate metal pillars embedded in the intermediate ILD layer, depositing a conductive metal cap on top of the intermediate ILD layer and the metal pillars, performing magnetic fabrication stage to make a magnetic material portion of the memory cell being manufactured, and performing back end on-line (BEOL) stage to make metal and contacts of the memory cell being manufactured.

10 Claims, 33 Drawing Sheets

Related U.S. Application Data application No. 14/028,216, which is a continuation-in-part of application No. 11/678,515, filed on Feb. 23, 2007, now Pat. No. 8,058,696, application No. 14/028,216, which is a continuation-in-part of application No. 11/739,648, filed on Apr. 24, 2007, now Pat. No. 8,183,652, and a continuation-in-part of application No.11/776,692, filed on Jul. 12, 2007, now Pat. No. 8,063,459, and a continuation-in-part of application No. 11/860,467, filed on Sep. 24, 2007, now Pat. No. 8,018,011, and a continuation-in-part of application No. 11/866,830, filed on Oct. 3, 2007, now abandoned.

(60) Provisional application No. 60/853,115, filed on Oct. 20, 2006, provisional application No. 60/777,012, filed on Feb. 25, 2006.

FIG. 2b

| 68 | 67 | 70 |
|---|---|---|
| 322 | | |

FIG. 2c

| 68 | 67 | 70 |
|---|---|---|
| 324 | 322 | 324 |

FIG. 2d

| 68 | 67 | 70 |
|---|---|---|
| 354 | | 355 |

| 68 | 67 | 70 |
|---|---|---|
| 354 | 326 | 355 |

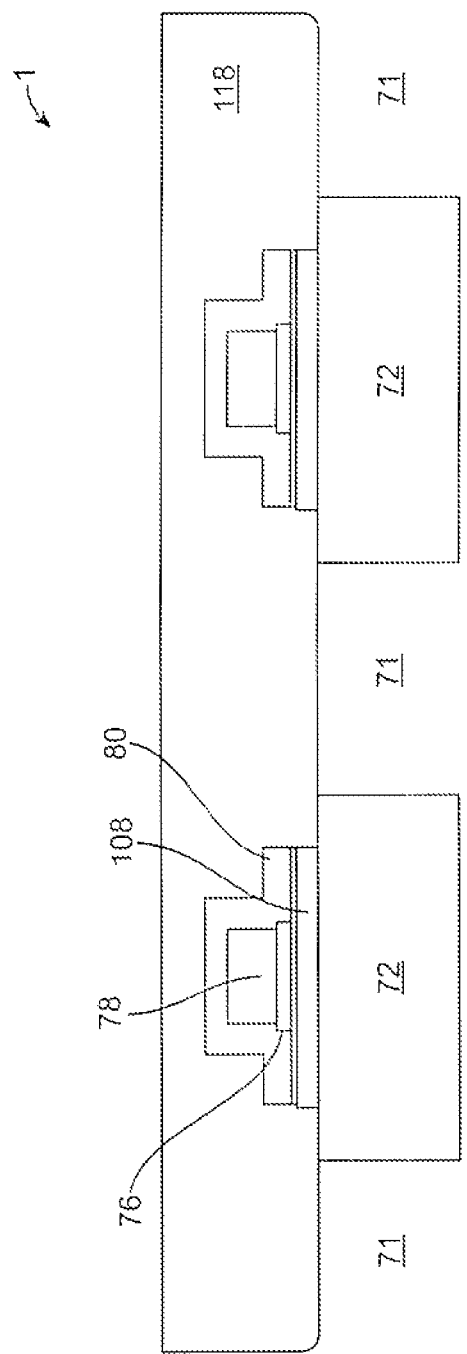

METHOD FOR MANUFACTURING NON-VOLATILE MAGNETIC MEMORY CELL IN TWO FACILITIES

CROSS REFERENCE TO RELATED APPLICATIONS

This application is a continuation of U.S. patent application Ser. No. 12/040,827, filed on Feb. 29, 2008, by Rajiv Yadav Ranjan, and entitled "Method For Manufacturing Non-Volatile Magnetic Memory", which is a continuation-in-part of U.S. application Ser. No. 11/674,124 filed on Feb. 12, 2007, entitled "Non-Uniform Switching Based Non-Volatile Magnetic Based Memory," which claims priority to U.S. Provisional Application No. 60/853,115 filed on Oct. 20, 2006 entitled "Non-Uniform Switching Based Non-Volatile Magnetic Based Memory"; and is a further continuation-in-part of U.S. application Ser. No. 11/678,515 filed Feb. 23, 2007, entitled "A High Capacity Low Cost Multi-State Magnetic Memory," which claims priority to U.S. Provisional Application No. 60/777,012 filed Feb. 25, 2006 entitled "A High Capacity Low Cost Multi-State Magnetic Memory"; and is a further continuation-in-part of U.S. application Ser. No. 11/739,648, filed Apr. 24, 2007 entitled "Non-Volatile Magnetic Memory with Low Switching Current and High Thermal Stability"; and is a further continuation-in-part of U.S. application Ser. No. 11/776,692, filed Jul. 12, 2007, titled "Non-Volatile Magnetic Memory Element with Graded Layer"; and is a further continuation-in-part of U.S. application Ser. No. 11/860,467 filed Sep. 24, 2007, titled "Low cost multi-state magnetic memory"; and is a further continuation-in-part of U.S. application Ser. No. 11/866,830 filed Oct. 3, 2007 entitled "Improved High Capacity Low Cost Multi-State Magnetic Memory"; and is a further continuation-in-part of U.S. Application No. Not Yet Assigned filed concurrently herewith entitled "An Improved Low Resistance High-TMR Magnetic Tunnel Junction and Process for Fabrication Thereof."

BACKGROUND OF THE INVENTION

1. Field of the Invention

The present invention relates generally to magnetic memory and particularly to methods of manufacturing magnetic memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (TOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic RAM (or phase-change memory), Ferroelectric RAM (FeRAM), Magnetic RAM (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art methods of producing MRAM is that prior art methods are very costly. This high cost is driven by the fact that prior art methods have a low memory-element-per-wafer yield, are unreliable, and are not modular.

In MRAM production, as with many other type of memory production, there is a fixed cost per-wafer. As a result, the more MRAM memory cells that can be manufactured on a single wafer, the lower the cost per memory cell. Prior art methods have an undesirably low memory-element-per-wafer yield making each memory cell correspondingly more costly.

A further problem with prior art methods is that the methods of production are unreliable. Unreliable methods lead to the frequent fabrication of non-functioning memory cells. Each non-functioning unit increases the per-unit cost of the remaining, functioning units.

Also, the non-modular nature of prior art methods exacerbates the cost and reliability problems. The nature of complementary metal-oxide-semiconductor (CMOS) production, used in many types of RAM production, generally precludes the use of many materials present in MRAM production inside CMOS facilities. Thus, with prior art methods, a facility must be wholly converted to MRAM production further increasing the costs. Additionally, contamination results from an MRAM and CMOS combined processes.

These problems reduce MRAM's competitive edge relative to DRAM, SRAM, EEPROM/NOR flash, NAND flash, and HDD storage solutions.

Thus, the need arises for a method of manufacturing a low cost (high volume), high-yield, high-reliability magnetic memory.

SUMMARY OF THE INVENTION

Briefly, in accordance with a method of the present invention, a method of manufacturing a magnetic random access memory (MRAM) cell and a corresponding structure thereof are disclosed to include a multi-stage manufacturing process. The multi-stage manufacturing process includes performing a front end on-line (FEOL) stage to manufacture logic and non-magnetic portions of the memory cell by forming an intermediate interlayer dielectric (ILD) layer, forming intermediate metal pillars embedded in the intermediate ILD layer, depositing a conductive metal cap on top of the intermediate ILD layer and the metal pillars, performing magnetic fabrication stage to make a magnetic material portion of the memory cell being manufactured, and performing back end on-line (BEOL) stage to make metal and contacts of the memory cell being manufactured.

These and other objects and advantages of the present invention will no doubt become apparent to those skilled in the art after having read the following detailed description of the preferred embodiments illustrated in the several figures of the drawing.

IN THE DRAWINGS

FIG. 1 shows a flow chart of the relevant steps performed for manufacturing non-volatile magnetic memory cells (for example, magnetic random access memory (MRAM)), in accordance with a method of the present invention.

FIG. 2 presents a cross section of a memory cell 1, in accordance with the techniques of FIG. 1.

FIG. 2a presents a cross section of a memory cell 1, in accordance with the techniques of FIG. 1.

FIG. 3 shows the structure of a number of memory cells after the CMOS step 10 has been completed, the source, gate and drain are shown to be formed substantially parallel to one another.

FIG. 4 shows the structure of a number of memory cells after the step 12. The memory cell is shown to include the drain, source, and gate, ILD layer and metal contact pillar.

FIG. 5 shows the structure of a number of memory cells after step 14. The memory cell is shown to include the drain, source, and gate, ILD layer, metal contact pillar, and ILD layer.

FIG. 6 shows the structure of a number of memory cells after the step 16. The memory cell is shown to include the drain, source, and gate ILD layer, metal contact pillar, and a post-etch ILD layer with pillar holes.

Figure 7:
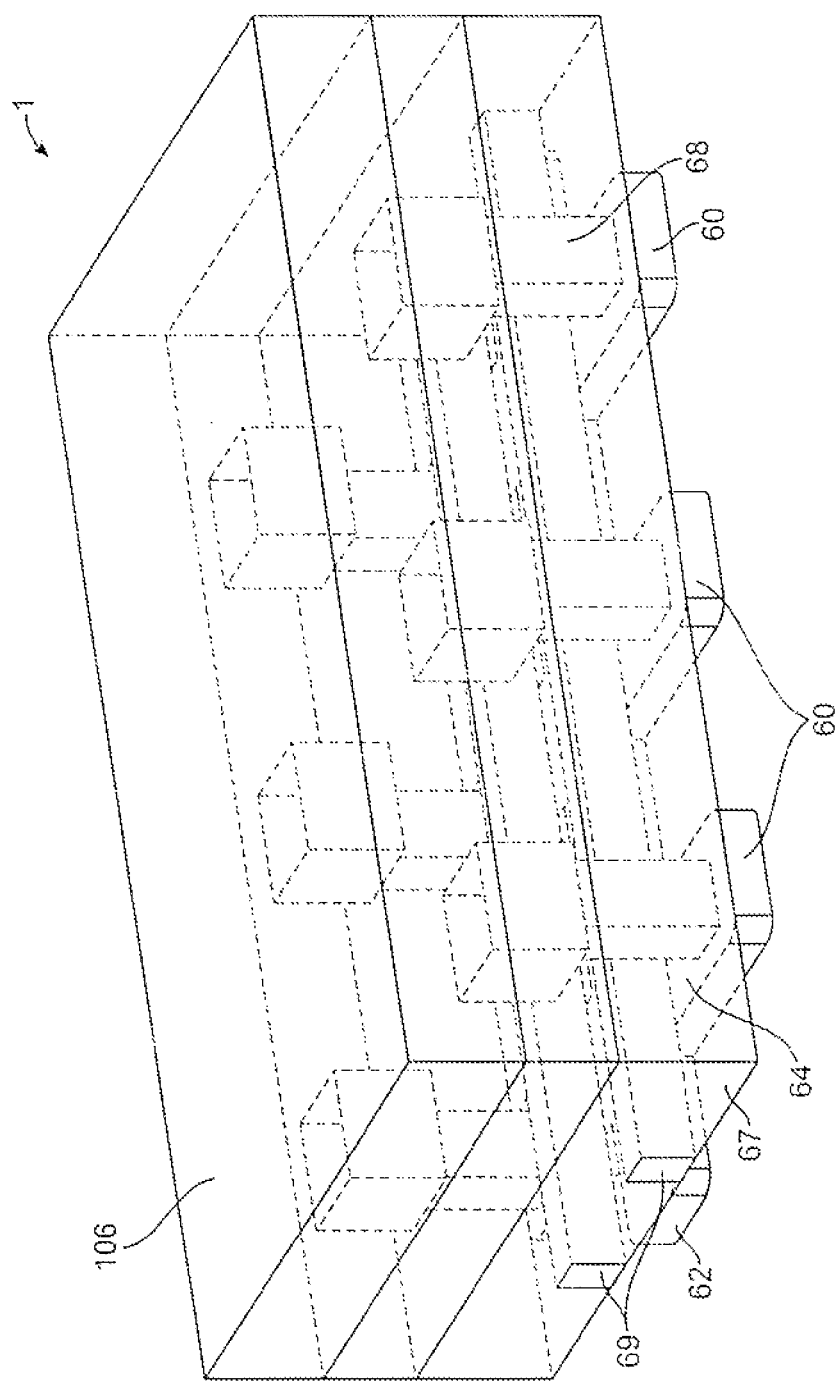
Figure 8:
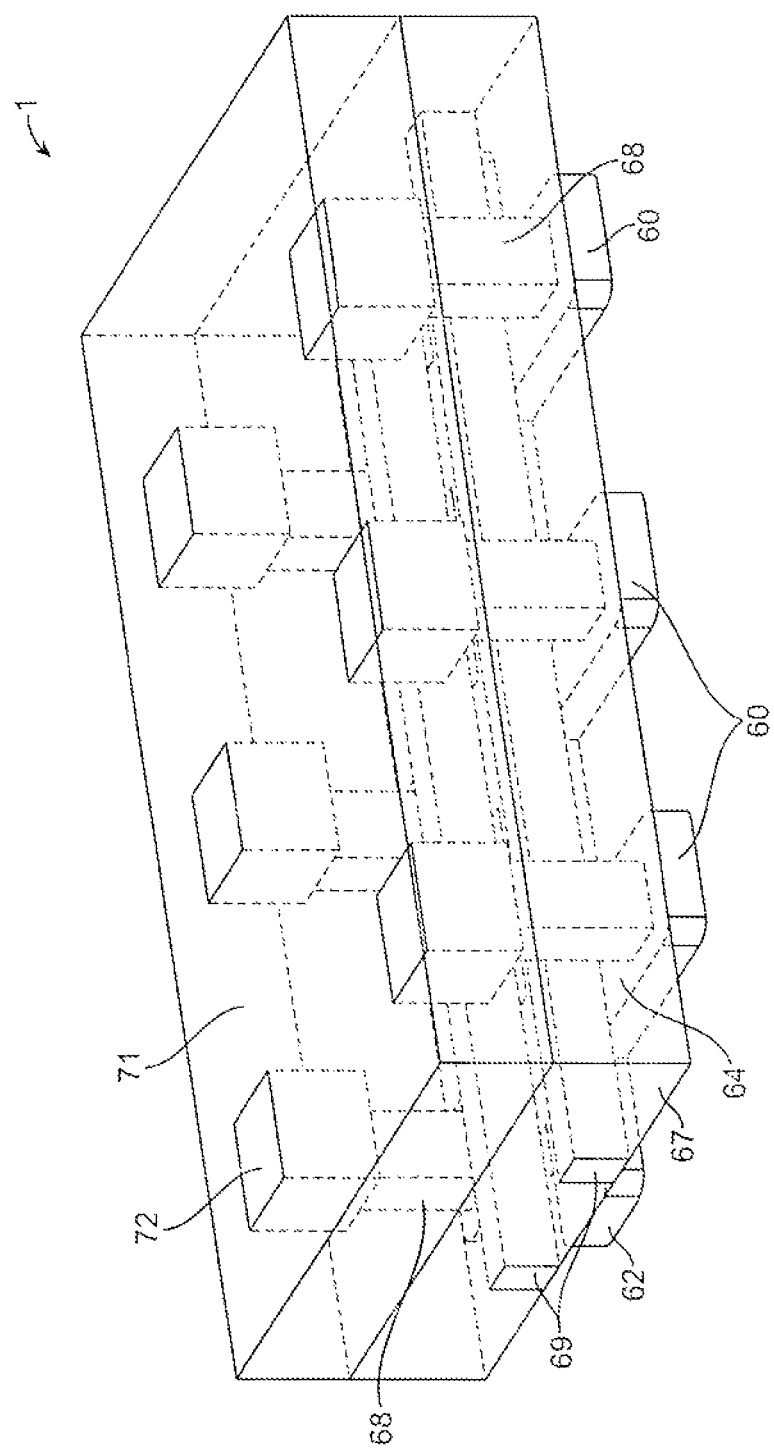

FIG. 7 shows the structure of a number of memory cells after the step 18. The memory cell is shown to include the drain, source, and gate, ILD layer, metal contact pillar, post-etch ILD layer with pillar holes, and metal material FIG. 8 shows the structure of a number of memory cells after the step 20. The memory cell is shown to include the drain, source, and gate, ILD layer, metal contact pillar, ILD layer, and metal pillar.

Figure 9:
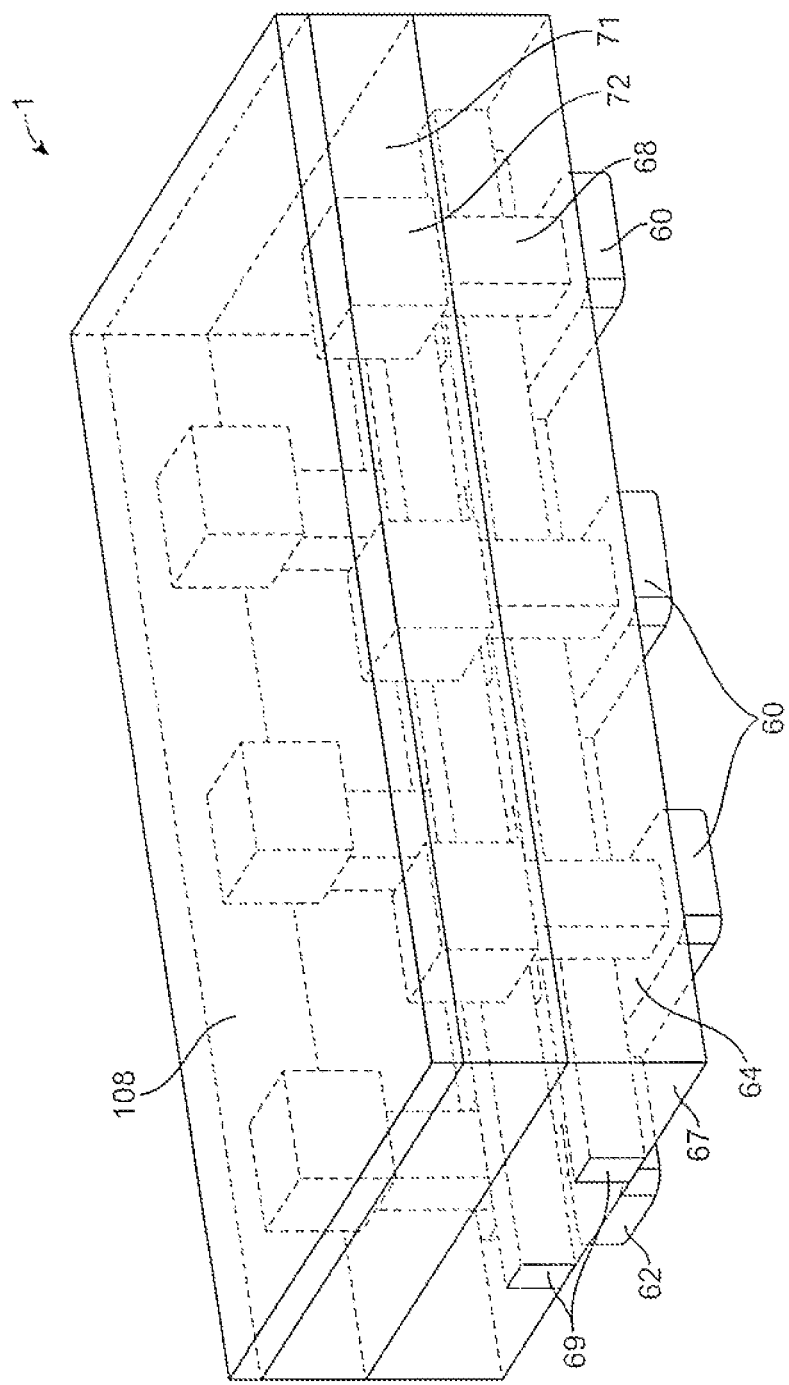

FIG. 9 shows the structure of a number of memory cells after the step 22. The memory cell is shown to include the drain, source, and gate, ILD layer, metal contact pillar, ILD layer, metal pillar, and conductive metal cap.

Figure 10:
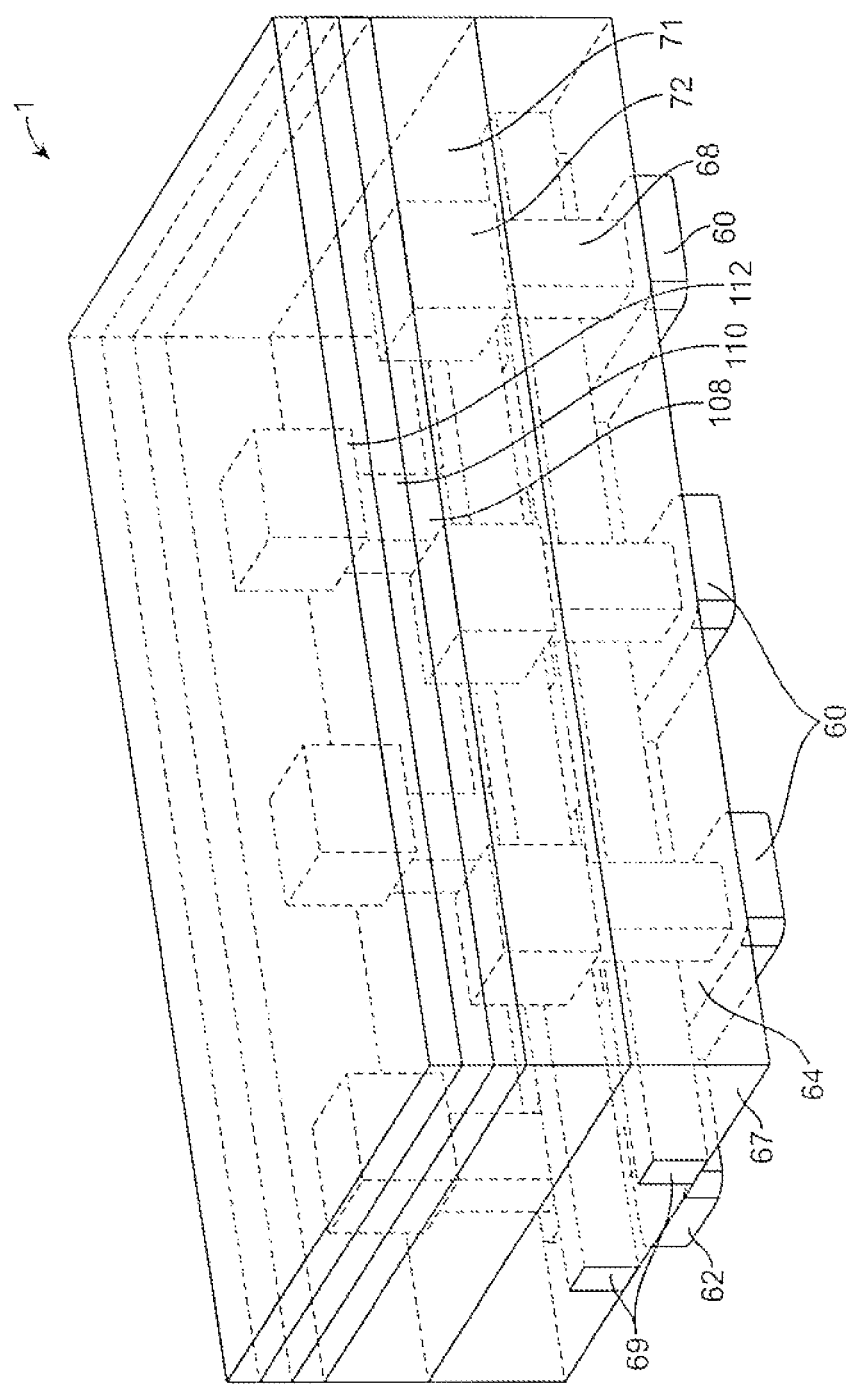

FIG. 10 shows the structure of six memory cells after the step 24. The memory cell is shown to include the drain, source, and gate, ILD layer, metal contact pillar, ILD layer, metal pillar, conductive metal cap, MTJ film, and conductive metal cap/hard mask.

Figure 11:
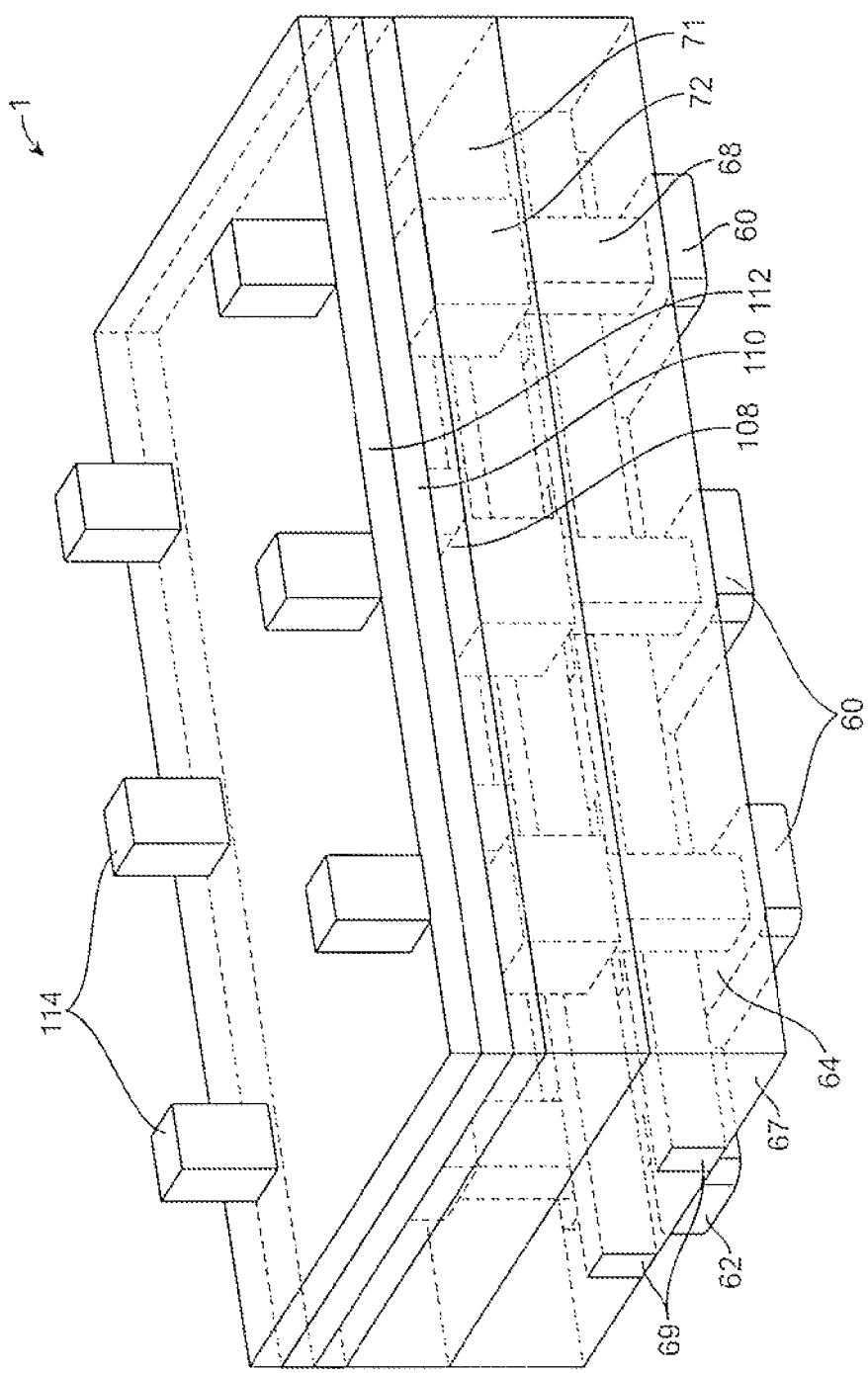

FIG. 11 shows the structure of a number of memory cells after the step 26. The memory cell is shown to include the drain, source, and gate, ILD layer, metal contact pillar, ILD layer, metal pillar, conductive metal cap, MTJ film, conductive metal cap/hard mask and photo-resist pillars.

Figure 12:
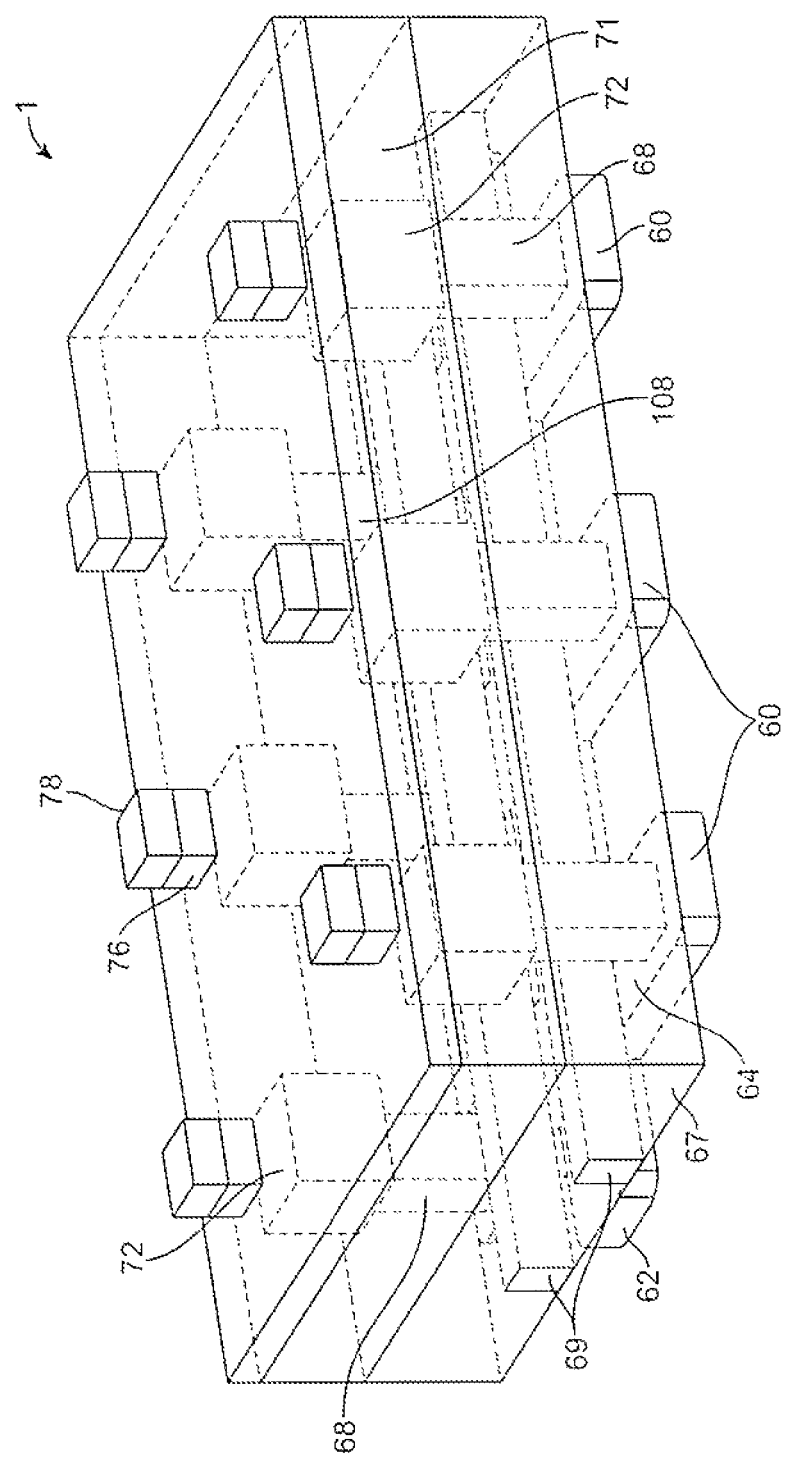

FIG. 12 shows the structure of six memory cells after the step 28. The memory cell is shown to include drain, source, and gate, ILD layer, metal contact pillar, ILD layer, metal pillar, conductive metal cap, MTJ, and conductive metal cap/hard mask.

Figure 13:
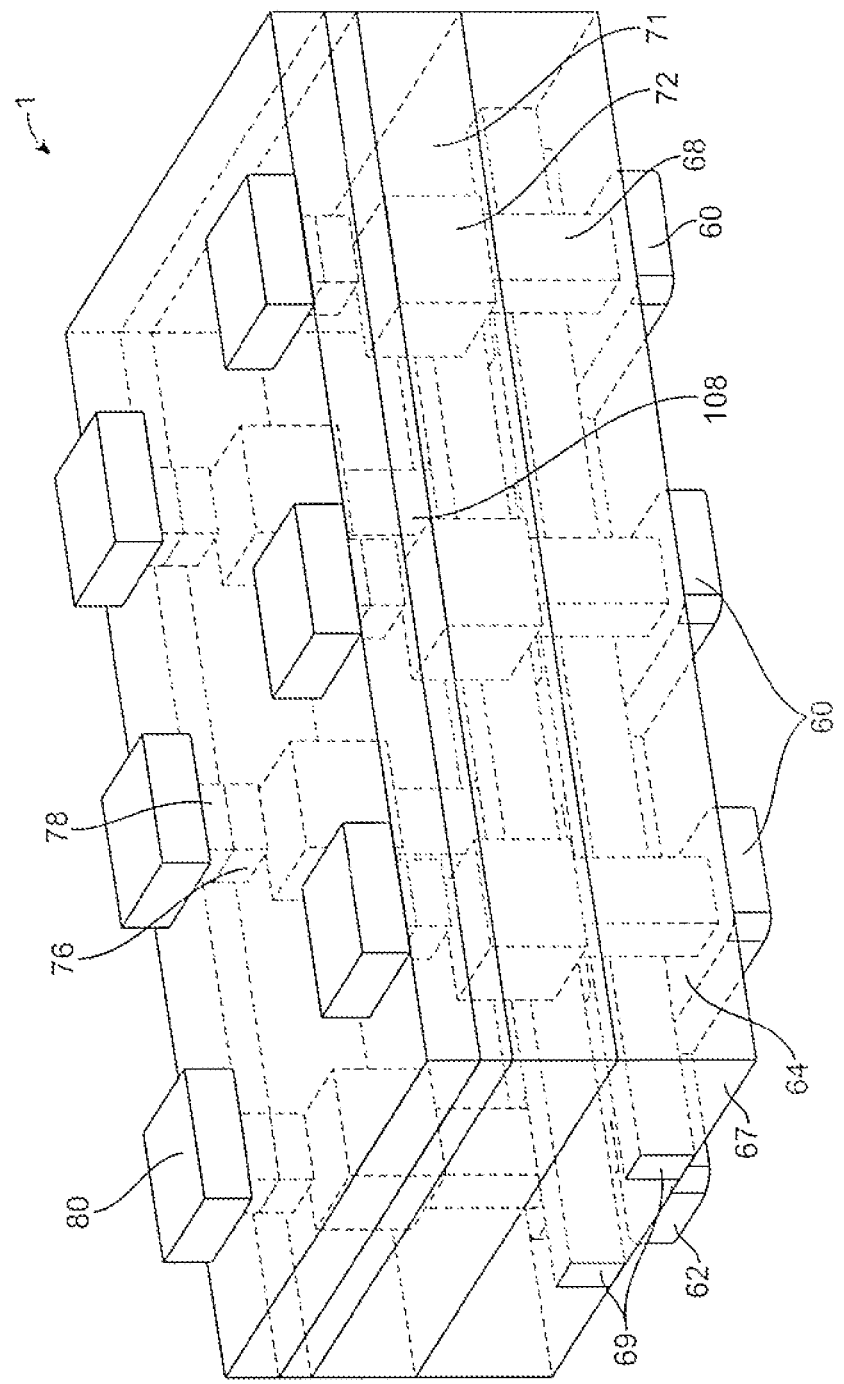

FIG. 13 shows the structure of a number of memory cells after the step 30. The memory cell is shown to include the drain, source, and gate, ILD layer, metal contact pillar, ILD layer, metal pillar, conductive metal cap, MTJ, conductive metal cap/hard mask, and passivation layer.

Figure 14:
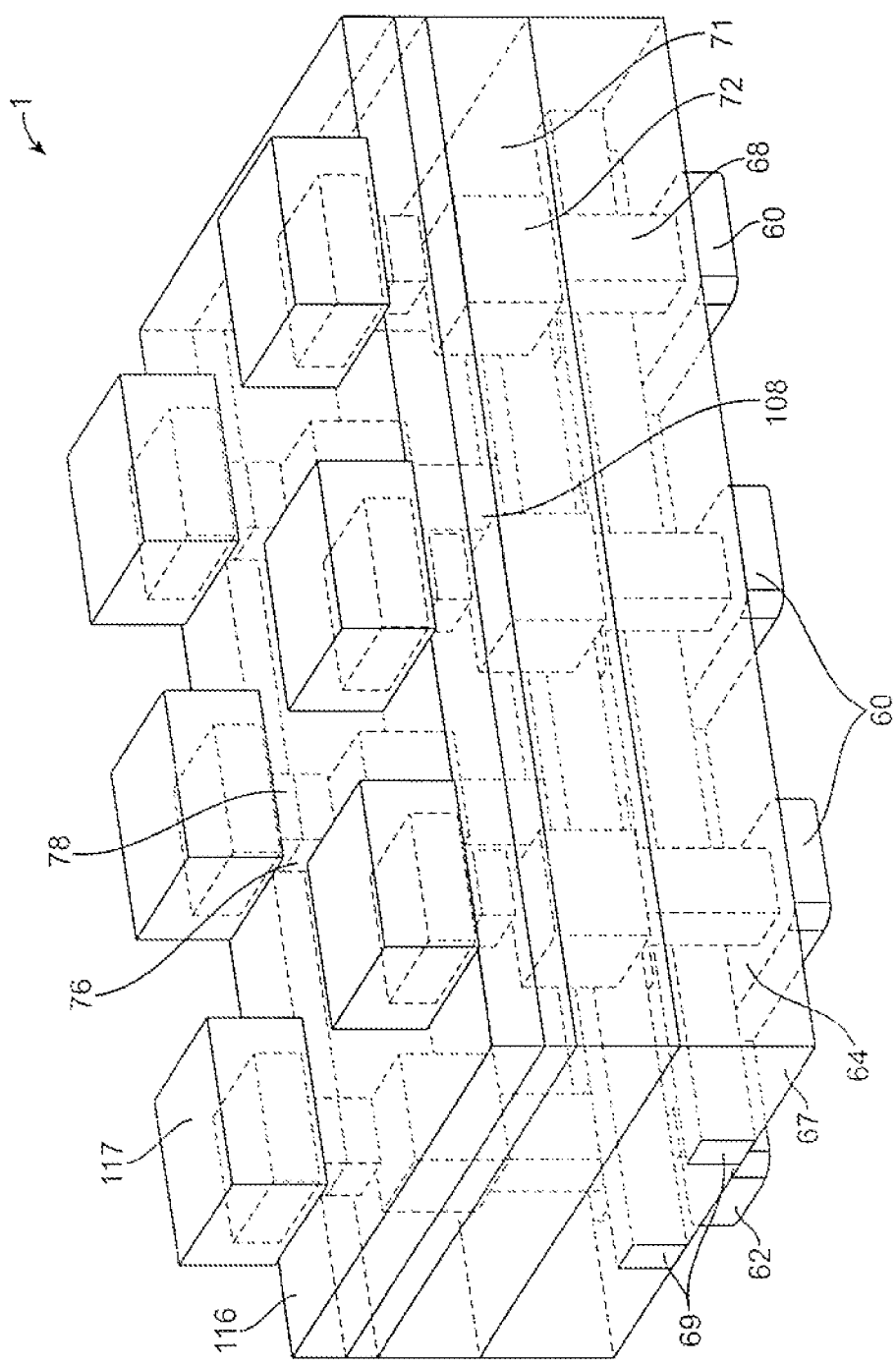

FIG. 14 shows the structure of a number of memory cells after the step 32. The memory cell is shown to include the drain, source, and gate, ILD layer, metal contact pillar, ILD layer, metal pillar, conductive metal cap, MTJ, conductive metal cap/hard mask, passivation layer, and photo resist pillars.

Figure 15:
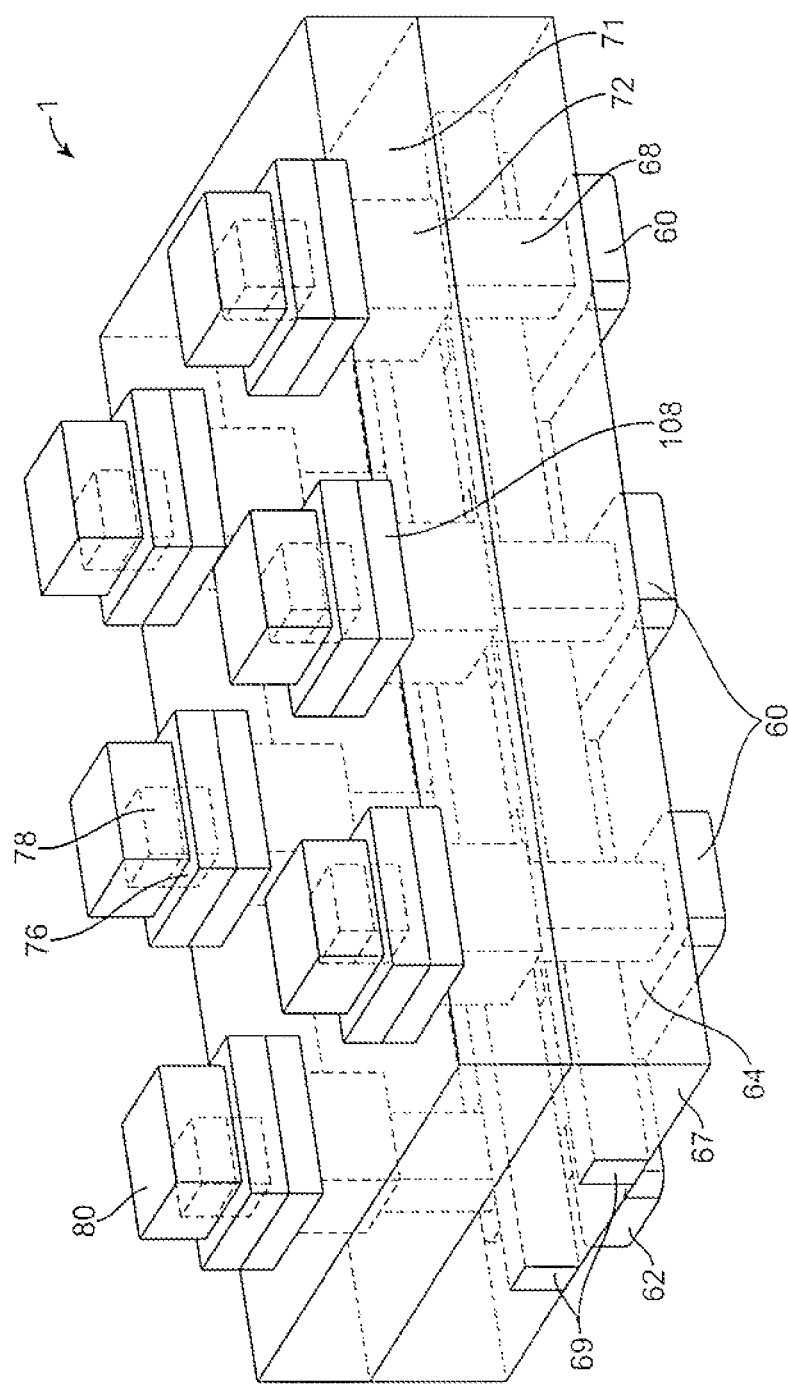

FIG. 15 shows the structure of a number of memory cells after the step 34. The memory cell is shown to include the drain, source, and gate, ILD layer, metal contact pillar, ILD layer, metal pillar, conductive metal cap, MTJ, conductive metal cap/hard mask, and passivation cap.

Figure 16:
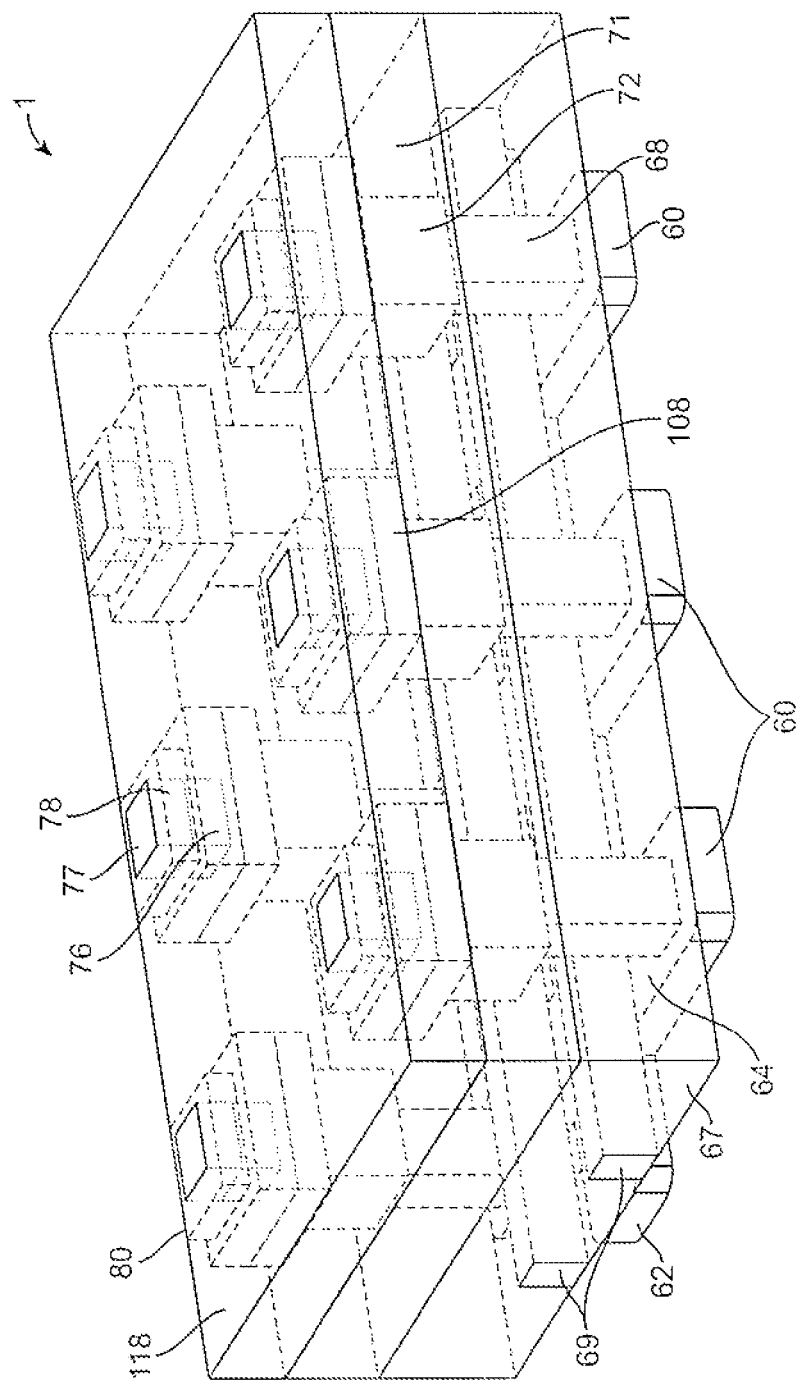

FIG. 16 shows the structure of a number of memory cells after the step 36. The memory cell is shown to include the drain, source, and gate, ILD layer, metal contact pillar, ILD layer, metal pillar, conductive metal cap, MTJ, conductive metal cap/hard mask, passivation cap, and ILD layer.

Figure 17:
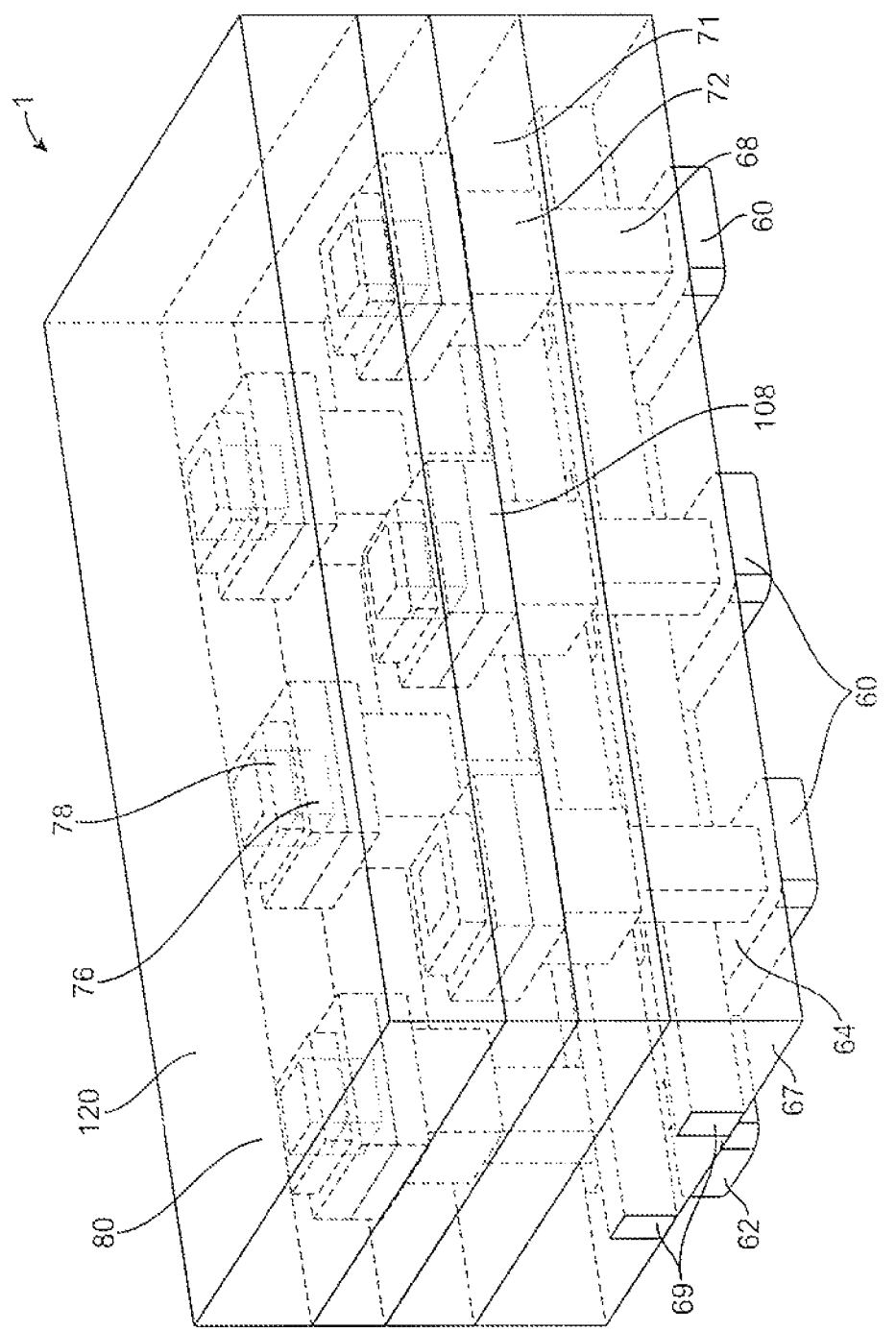

FIG. 17 shows the structure of a number of memory cells after the step 38. The memory cell is shown to include the drain, source, and gate, ILD layer, metal contact pillar, ILD layer, metal pillar, conductive metal cap, MTJ, conductive metal cap layer, passivation cap, ILD layer, and the metal layer.

Figure 18:
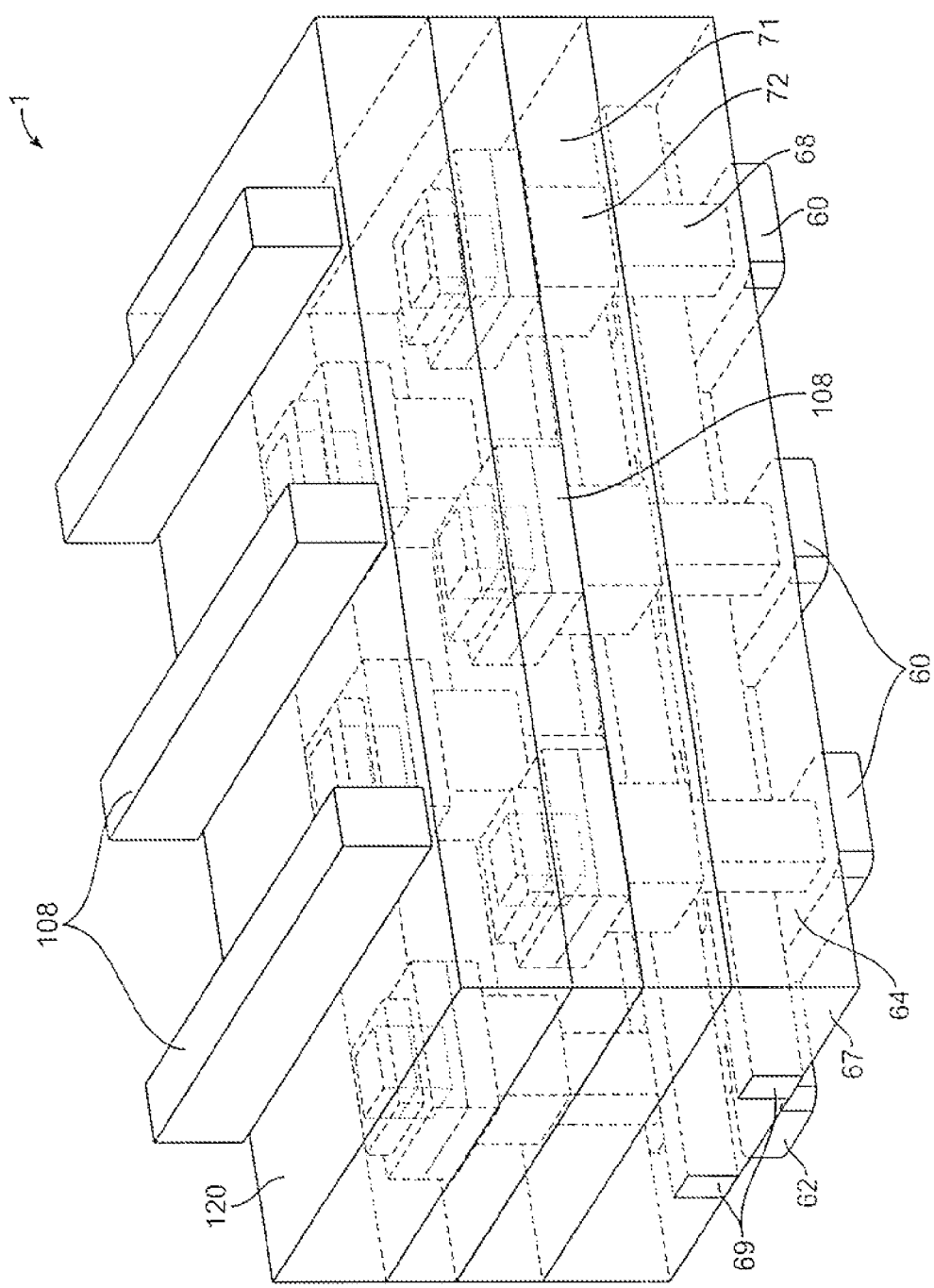

FIG. 18 shows the structure of a number of memory cells after the step 40. The memory cell is shown to include the drain, source, and gate, ILD layer, metal contact pillar, ILD layer, metal pillar, conductive metal cap, MTJ, conductive metal cap layer, passivation cap, ILD layer, a metal layer, and a photo resist bars.

Figure 19:
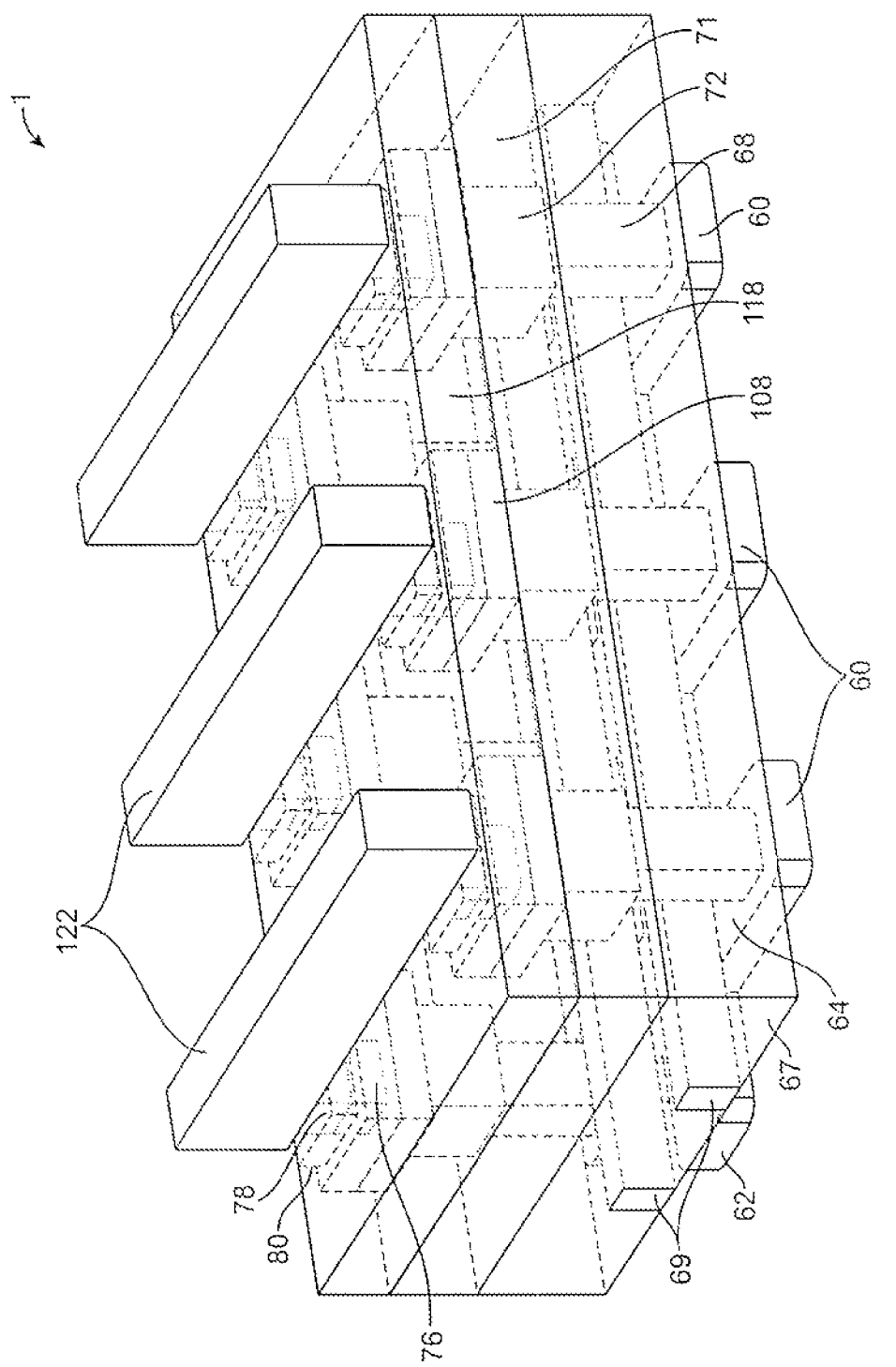

FIG. 19 shows the structure of a number of memory cells after the step 42. The memory cell is shown to include the drain, source, and gate, ILD layer, metal contact pillar, ILD layer, metal pillar, conductive metal cap, MTJ, conductive metal cap layer, passivation cap, ILD layer, and metal bars.

Figure 20:
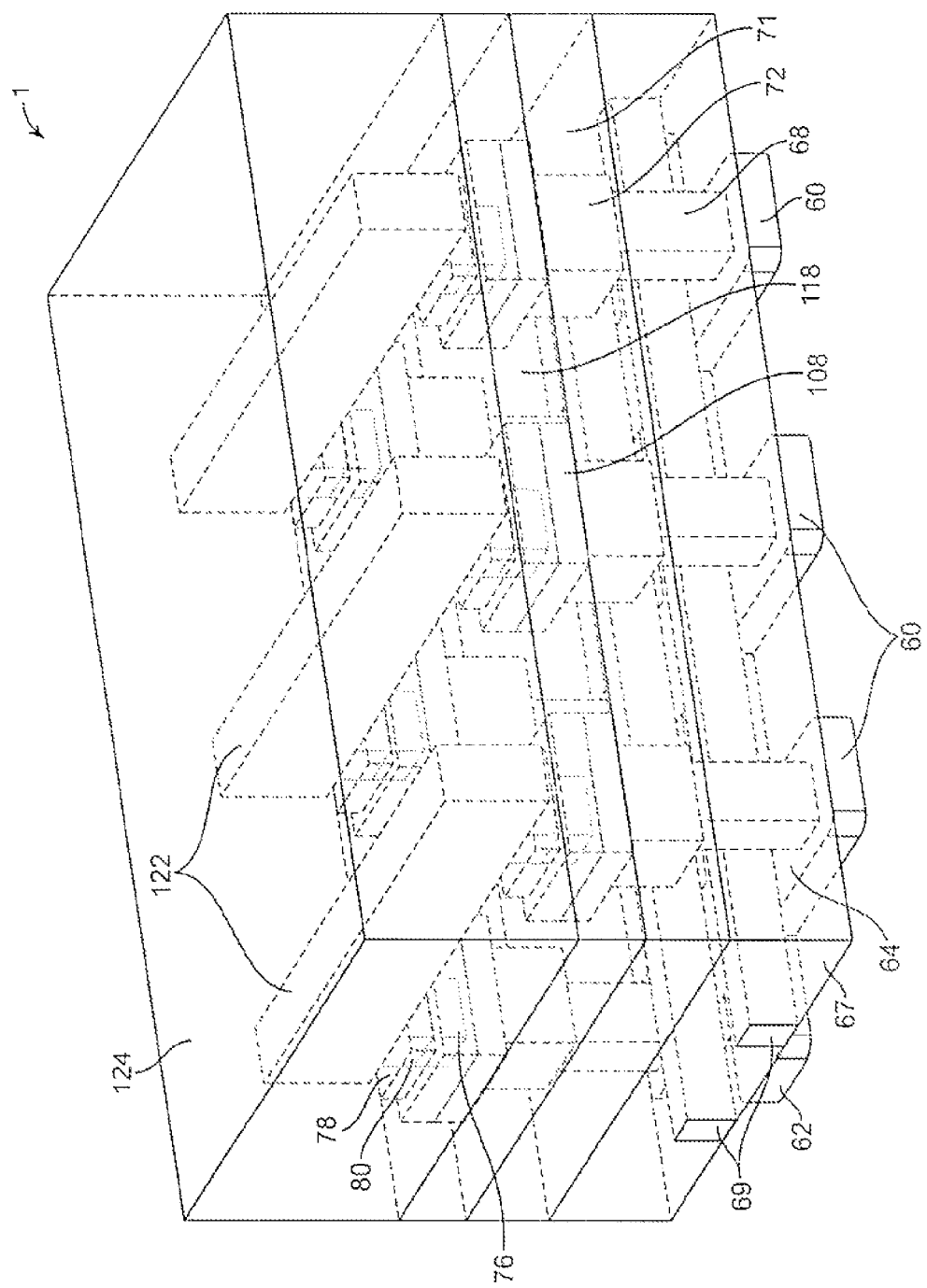

FIG. 20 shows the structure of a number of memory cells after the step 44. The memory cell is shown to include the drain, source, and gate, ILD layer, metal contact pillar, ILD layer, metal pillar, conductive metal cap, MTJ, conductive metal cap layer, passivation cap, ILD layer, metal bars, and a passivation layer.

Figure 21:
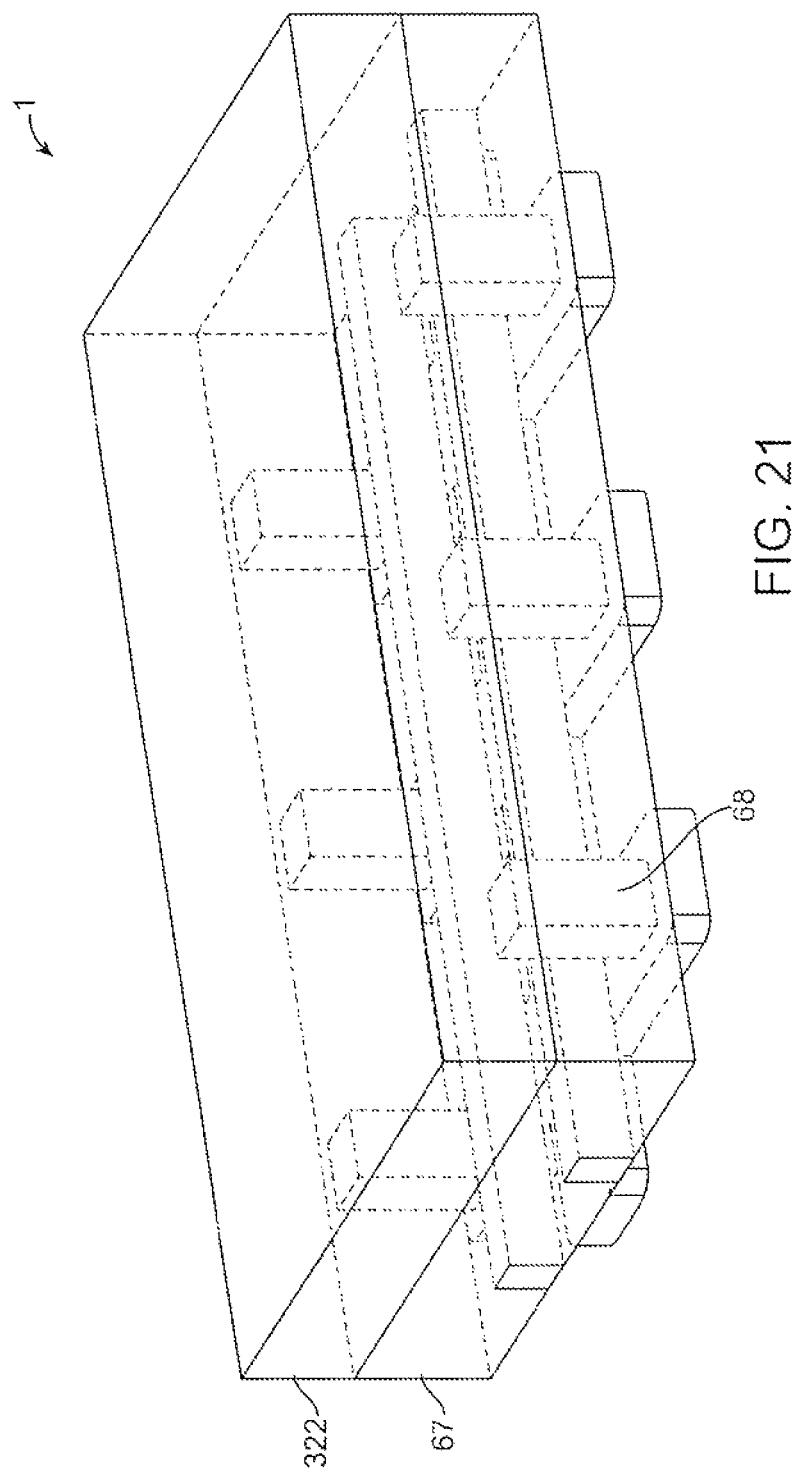

FIG. 21 shows the structure of the memory cell 398 after step 314.

Figure 22:
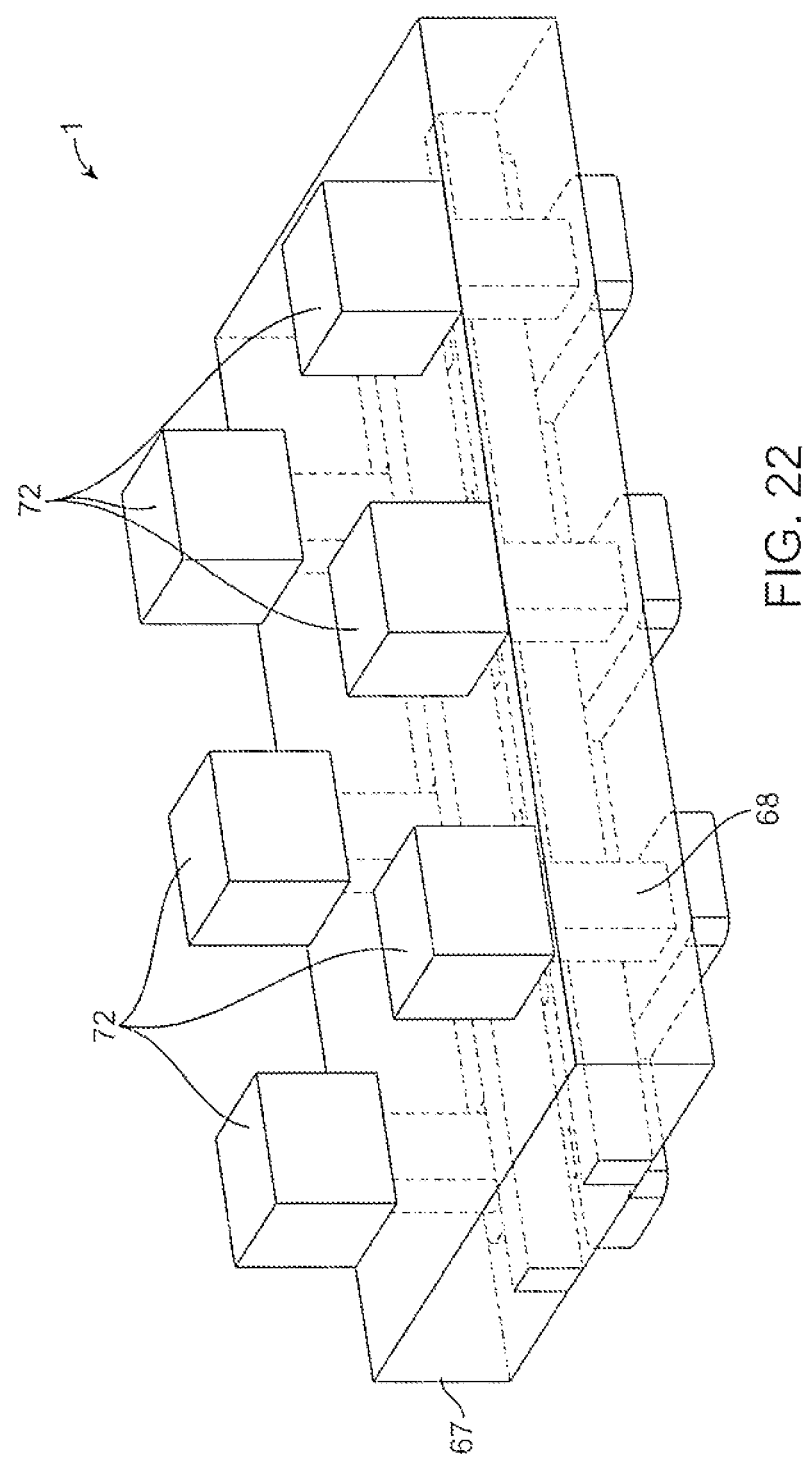

FIG. 22 shows the structure of the memory cell 398 after step 316.

Figure 23:
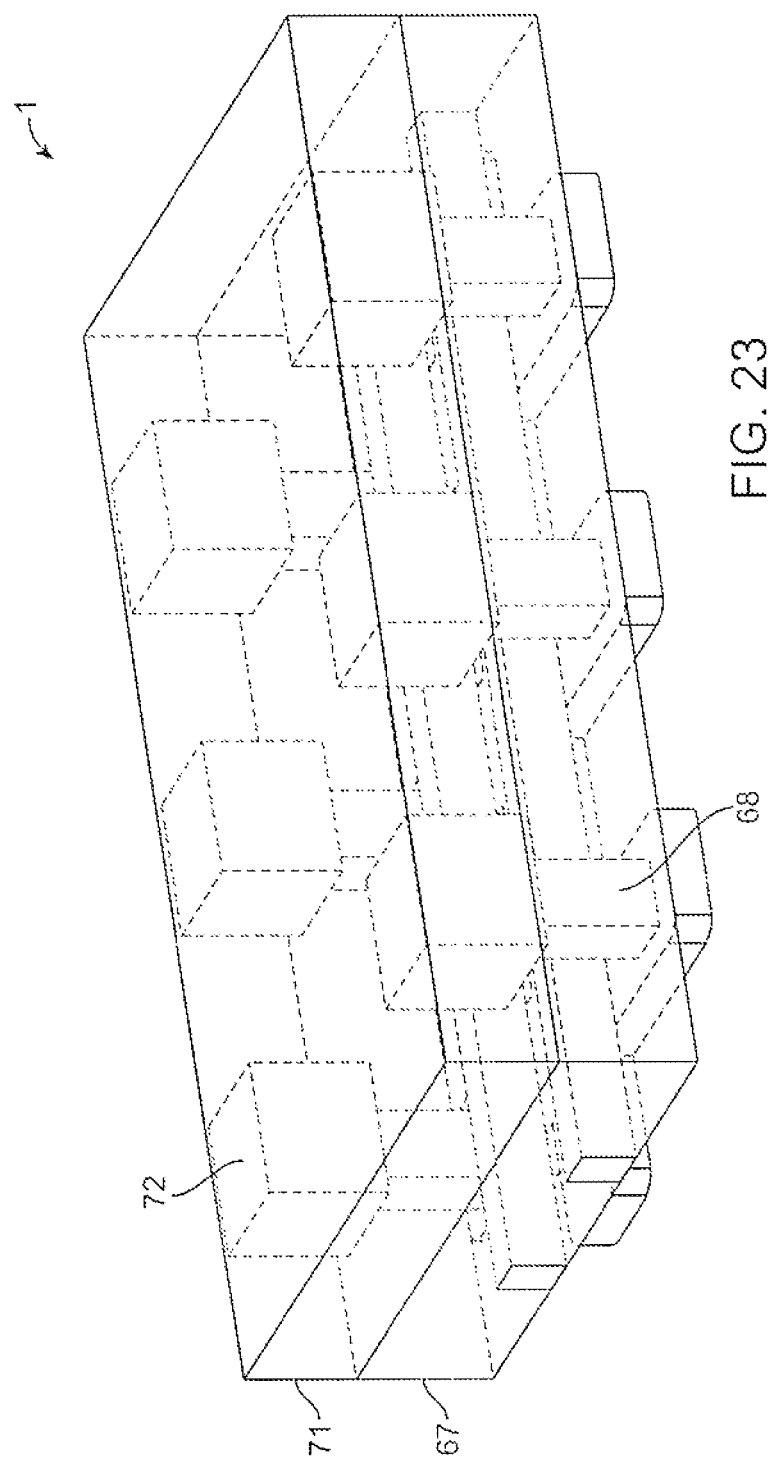

FIG. 23 shows the structure of the memory cell 398 after steps 318 and 320.

DETAILED DESCRIPTION OF THE EMBODIMENTS

Figure 1:
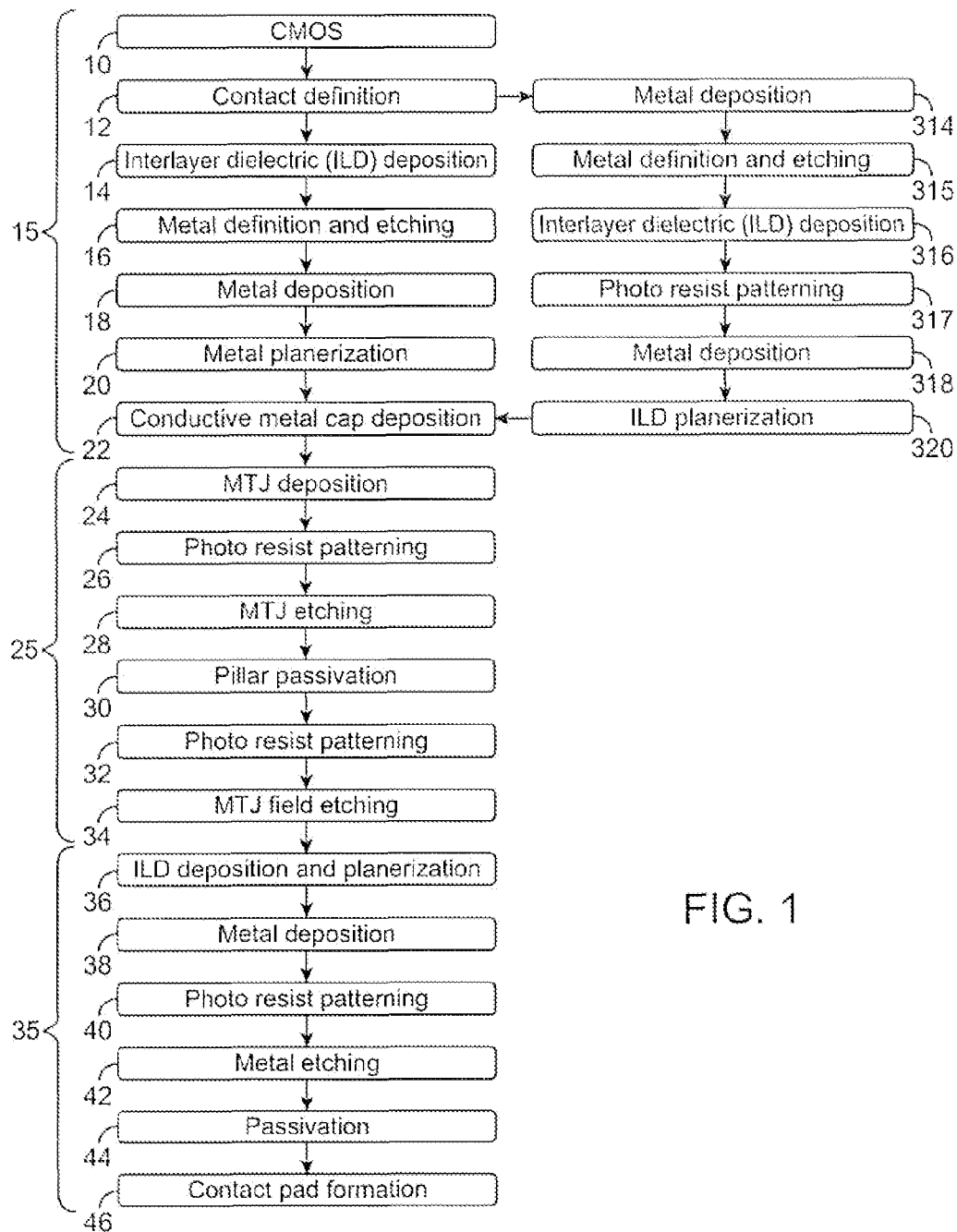

Referring now to FIG. 1, a flow-chart of the relevant steps performed for manufacturing non-volatile magnetic memory cells (for example, magnetic random access memory (MRAM)) is shown in accordance with a method of the present invention. In FIG. 1, a damascene process is used to efficiently and reliably manufacture arrays of memory cells, onto, for example, a wafer, which includes many memory cells. In manufacturing MRAMs, a complimentary metal-oxide-semiconductor (CMOS) as well as magnetic manufacturing processes are employed. That is, magnetic memory is manufactured using magnetic processes and logic or transistors, used to connect the magnetic memory and other logic for addressing and/or reading and writing to the magnetic memory, is manufactured generally using CMOS processes. The method of FIG. 1 allows modularity of the CMOS and magnetic processes in that the magnetic memory can be manufactured at a processing plant (or facility) that is independent and separate from a plant used to manufacture the logic. Additionally, intermediate process control steps are introduced to ensure that the process is within the process tolerance limits for a high yielding low-cost manufacturing process. Intermediate process control steps refer to wafer probing step to ensure that the preceding process steps were completed within specifications and are most efficiently inserted after step 20 in FIG. 1.

Multiple stages of manufacturing are employed for advantageously causing modularity of manufacturing to reduce costs and contamination. For example, during a front end on-line (FEOL) stage 15, logic and non-magnetic portions of a memory cell are manufactured and during to a magnetic fabrication stage 25, the magnetic material portion of the memory cell is manufactured. Finally, a back end on-line (BEOL) stage 35 is employed to manufacture metal and other types of contacts.

In FIG. 1, the FEOL stage 15 is shown to include steps 10-22, the magnetic fabrication stage 25 is shown to include steps 24-34 and the BEOL stage 35 is shown to include steps 36-46, in accordance with a method of the present invention. Accordingly, the FEOL stage 15 is performed, followed by the magnetic fabrication stage 25, followed by the BEOL stage 35.

Alternatively, the FEOL stage 15 includes steps 314-320 and 22 with the steps 314-320 replacing the steps 14-20, respectively, in which case steps 10 and 12 are performed followed by steps 314-320, followed by the magnetic fabrication stage 25 followed by the BEOL stage 35.

Figure 2:
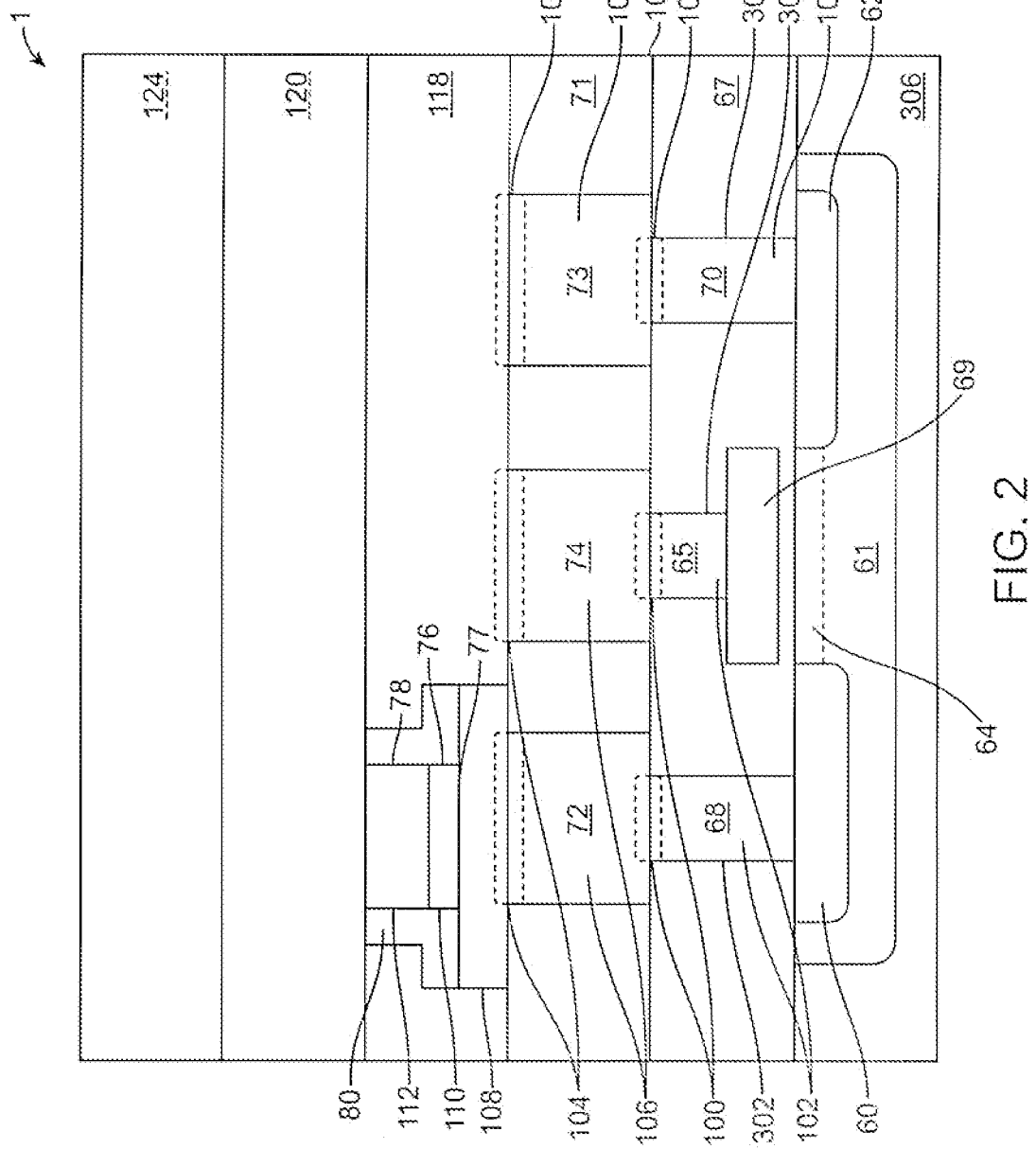
FIG. 2b shows the structure of the memory cell after the metal deposition step 314 has been completed.
FIGS. 2c and 2d show the structure of the memory cell after the metal area defining and etching step 315 has been completed.
FIG. 2e shows the structure of the memory cell after the ILD deposition step 316 has been completed.
FIG. 2f shows the structure of the memory cell after the photo resist deposition and etching step 317 has been completed.
FIG. 2g shows the structure of the memory cell after the metal deposition step 318 has been completed.
FIG. 2h shows the structure of the memory cell after the ILD planerization step 320 has been completed.
FIG. 2i shows a cross section of the wafer.
FIG. 2j shows the small hump 130 that forms above the MTJ 76 as part of the deposition process.
FIG. 2k shows the ILD layer 118 is planerized using CMP until the top of the passivation cap 80 is exposed.
FIG. 2l shows the CMP slurry is changed and the passivation cap 80 is planerized using CMP until the top of conductive metal pillar 78 is exposed.

FIG. 2 presents a cross section of a memory cell 1, as the memory cell is being built on top of a CMOS circuit element, which is shown formed on a wafer 306, in accordance with the process of FIG. 1. More specifically, FIG. 2 shows a cross section of a single non-volatile magnetic memory cell 1, in accordance with an embodiment of the present invention. For ease of understanding, FIGS. 1 and 2 are discussed interchangeably to further clarify forming the memory cell 1.

Referring back to FIG. 1, a CMOS step 10 is performed, during which logic (also known as semiconductor or circuit) is built. Such semiconductor includes, for example, transistors. In the method of FIG. 1, a transistor is fabricated and covered with a bottom interlayer dielectric (ILD) layer, also known as pre-metal dielectric, which is shown and discussed relative to FIG. 2 as an ILD layer 67.

An exemplary structure formed at the completion of FIG. 1 is shown in FIG. 2 where a transistor (or "circuit(s)", "semiconductor" or "logic") 61 is formed on the wafer 306 above which is formed a bottom ILD layer 67. The transistor 61 is shown in FIG. 2 to include a source 60, drain 62, and a channel 64, and gate 69. The gate 69 is electrically separated from channel with a thin gate oxide. The gate oxide thickness is typically in the range from 2 nm to 200 nm depending on the width of the gate (thickness ~2% of gate width). The ILD layer 67 serves as an insulating layer to prevent the transistor 61 formed at step 10 from short circuiting with circuitry that is not intended to be coupled to the transistor (or undesirable electrical connections). The transistor 61 serves as an access transistor for comparing the resistance of one or more memory cells to a reference transistor for reading/writing from and to the memory cell 1.

After the CMOS step 10, in FIG. 1, a contact definition step 12 is performed. During the contact definition step 12, photo-resist 58 (shown in FIG. 3a) is applied to the entire top of the ILD layer 67 and a contact area 100 is defined. The contact area 100 is defined as a portion on top of the ILD layer 67 that is situated above the source 60, the gate 69 and the drain 62 of the transistor 61, as shown in FIG. 2 and shown with further clarification in FIG. 3. Photo-resist 58 is used to control an etching process by preventing the material covered by the photo-resist from being etched. Thus, the ILD layer 67 is prevented from being etched except above the drain 62, the gate 69 and the source 60 where it is etched.

During the contact definition step 12 of FIG. 1, the ILD layer 67 of FIG. 2 is etched until the source 60, the gate 69 and drain 62 are exposed to form holes 302, 303 and 304. In an exemplary method, reactive ion etching (RIE) is performed to expose the drain and source of the transistor 61. It should be noted that the use of RIE is exemplary only and that other etching methods are contemplated. While other etching techniques are contemplated, an RIE process having a substantially gaseous by-product is used in the method of FIG. 1 to reduce the number of steps during manufacturing by eliminating a clean-up step, which is discussed in further detail below.

Thereafter, metal barrier (seed) layer 101 is deposited on top of the ILD layer 67 and into the sides and bottom of holes 302, 303 and 304 are covered with a barrier (seed) layer 101. Subsequently, a metal material 102 fills the holes 302, 303 and 304, on top of the barrier layer 101 to form metal pillars 65, 68 and 70. The metal pillars formed at this step are dispersed (or embedded) in the ILD layer 67.

In an exemplary manufacturing process, Physical Vapor Deposition (PVD) is used to deposit a barrier/seed layer 101 and Chemical Vapor Deposition (CVD) is used for the metal material 102. The barrier layer 101 is deposited on top of the ILD layer 67 and the metal material 102 is deposited on top of the barrier/seed layer 101.

It should be noted that the use of PVD to layer the barrier/seed layer 101 and the use of CVD to layer the metal materials 102 is exemplary only and other methods, such as atomic layer deposition (ALD), or electro-plating, are contemplated. The remaining metal material 102, or the metal material that covers the ILD layer 67 but that is not in the holes 302, 303 and 304, is planarized using chemical-mechanical polishing (CMP) until substantially only the pillars 65, 68 and 70 remain embedded in the ILD layer 67. CMP is used to remove excess metal material from metal layer 102 and the barrier/seed layer 101 thereby advantageously preventing short-circuits between pillars 65, 68 and 70 to undesirable electrical components. Pillar 68 is used to pass current from the source 60 to the MTJ 76. Pillar 70 serves to ground the MTJ 76.

In an exemplary embodiment, the metal material 102 is made of tungsten. It should be noted that use of tungsten is exemplary only and that the use of other conductive material that does not chemically react with silicon is contemplated.

After the contact definition step 12 in FIG. 1 is performed, an ILD step 14 is performed during which, an intermediate ILD layer 71 is deposited on top of the ILD layer 67, covering substantially the entire ILD layer 67, and pillars 65, 68, and 70. In an exemplary application, Silicon Oxide (SiO$_2$) is used as the ILD layer 71. It should be noted that the use of SiO$_2$ is exemplary only and other forms of ILD layers are contemplated. Typically, a thinner layer of SiN is deposited prior to the SiO$_2$ layer to create an etch stop for the subsequent etch process step 16.

After the ILD step 14 in FIG. 1, a metal area definition and etching step 16 is performed during which a metal deposition area 104 is defined, which is an area substantially on top of the ILD layer 67 and above pillars 68, 65 and 70. Subsequently, photo-resist 75, which is shown in FIG. 5a, is applied to substantially the entire top surface of the ILD layer 71 and patterned. ILD layer 71 is etched until the pillars 68, 65 and 70 are exposed. In an exemplary application, RIE is used to etch the ILD layer 71. It should be noted that the use of RIE to etch the ILD layer is exemplary only and other forms of etching are also contemplated.

After the metal area definition and etching step 16 in FIG. 1 is completed, a metal barrier (seed) layer 101 is deposited on top of the ILD layer 71 and into the sides and bottom of holes are covered with a barrier (seed) layer 101. Subsequently, a metal material 106 fills the holes on top of the barrier layer 101 to form metal pillars 72, 73 and 74, as shown in FIG. 2. The metal pillars formed at this step are dispersed (or embedded) in the ILD layer 71. The width of the metal pillars 72, 74 and 73 are each defined by the metal deposition area 104. In an exemplary application, the metal material 106 is copper. The use of copper is exemplary only and the use of other metals is also contemplated. Steps 16 and 18 are collectively a form of a Damascene process where trenches and vias are formed and thereafter filled with metal, such as copper, in the process flow of FIG. 1. While only a single metal is mentioned, other metal layers may be formed on top of a previous metal layer, separated by vias, in which case the MTJ 76 is formed in between the second to the top and the top-most layer and the top-most metal layer.

After the metal deposition step 18, in FIG. 1, a metal planerization step 20 is performed during which the metal material 106 is partially removed using CMP, leaving in place metal pillars 72, 74 and 73 (collectively known as "intermediate metal pillars"), and the ILD layer 71, as shown in FIG. 2. The metal pillar 72 is advantageously low in resistance and substantially thin in size thereby increasing power efficiency for the non-volatile magnetic memory elements included in the memory cell. For example, the metal pillar 72 may be made of copper, which has a very low resistance of approximately 0.05 ohm/square and a thickness of 2000 to 4000 Angstroms. It should be noted that all resistance and thickness values for the pillar 72 are exemplary only and other resistance values and thicknesses are also contemplated.

Figure 2A:
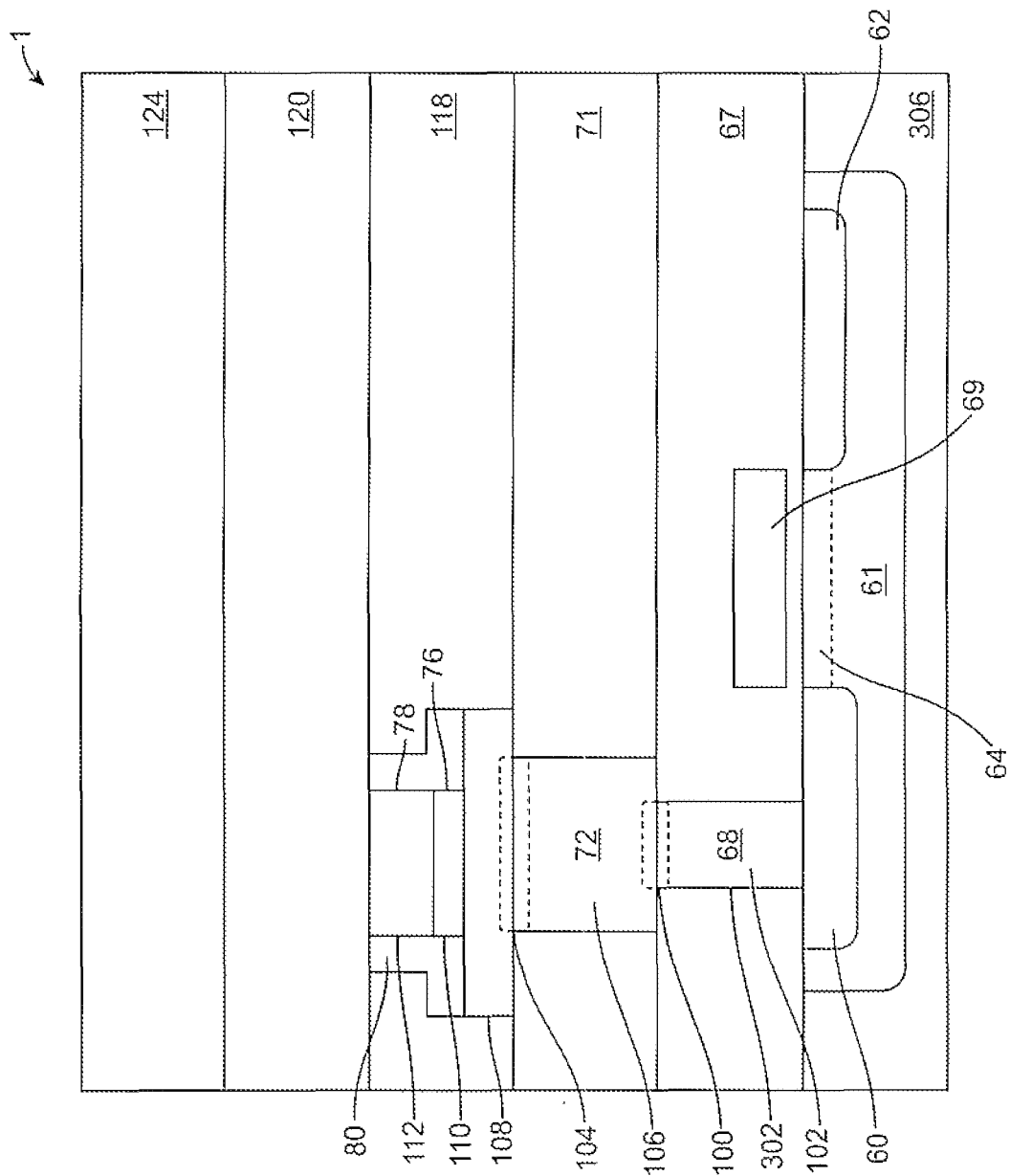
Figures 2G, 2H:
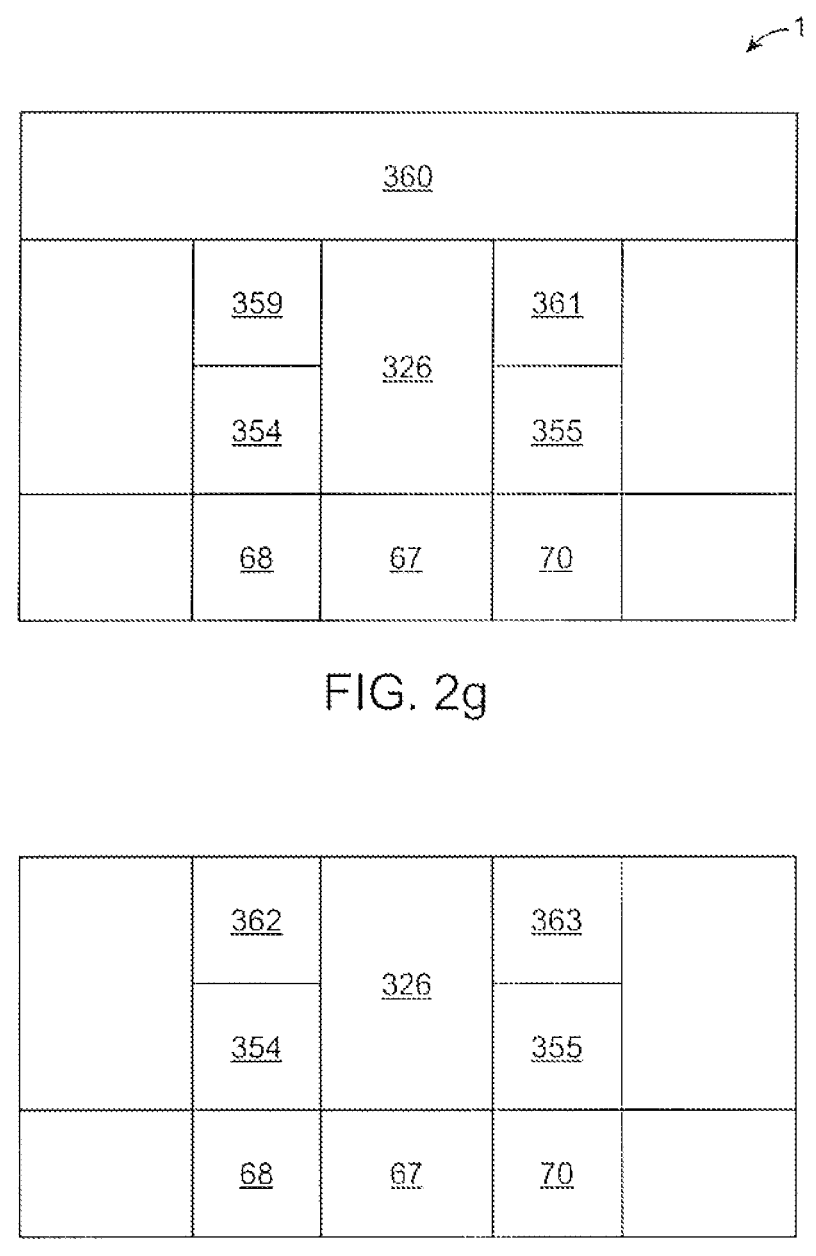

It should be noted that pillars 65, 73, and 74 are not present in every single memory cell. In an exemplary application, pillars 65, 70, 73, and 74 are formed every eighth circuit, but it is contemplated this number might change. It is shown in FIG. 2 to show how circuits with pillars 65, 70, 73, and 74 look. FIG. 2a shows a circuit without pillars 65, 70, 73, and 74. In embodiments where the pillars 65, 70, 73, and 74 are included only every so many, such as eight, circuits, is to reduce cell size hence reduce the cost as well as to decrease power and increase the reliability of the manufactured memory cell 1.

Alternatively, rather than the steps 14 through 20, a non-damascene process comprised of steps 314 through 320 shown in FIGS. 1 and 2b-2h may used. If this alternative method is used, after the contact definition step 12 in FIG. 1, a metal deposition step 314 is performed where a metal layer 322 is deposited covering substantially the entire ILD layer 67 including the pillars 68 and 70. In an exemplary application, the metal layer is made of aluminum. It should be noted that the use of aluminum is exemplary only and the use of other conductive material is also contemplated. For instance, aluminum with a cap of a harder metal like Ti to act as a mechanical stop to the subsequent CMP process step 320 may be employed.

After the metal deposition step 314 in FIG. 1, a metal area defining and etching step 315 is performed where a photo-resist pillar 324 are applied substantially above metal pillar 68. The metal layer is etched until metal pillars 354 and 355 remain.

After the metal area defining and etching step 315 FIG. 1, an ILD deposition step 316 is performed during which an ILD layer 326 is deposited covering substantially the entire wafer including metal pillars 354 and 355. In an exemplary application, Silicon Oxide (SiO$_2$) is used as the ILD layer 326. It should be noted that the use of SiO$_2$ is exemplary only and other forms of ILD layers are contemplated.

After the ILD deposition step 316 in FIG. 1, a photo-resist deposition and etching step 317 is performed during which photo resist 357 is deposited across the entire ILD layer 326 except in the defined area 358, which is substantially above metal pillars 354 and 355. After the photo resist is applied, the ILD layer 326 is etching until metal pillars 354 and 355 are exposed.

After the photo-resist deposition and etching step 317 in FIG. 1, a metal deposition step 318 is performed during which a metal layer 360 is deposited over the entire wafer, filling in holes 359 and 361. In an exemplary application, tungsten is used. It should be noted that the use of tungsten is exemplary only and the use of other materials is contemplated.

After a metal deposition step 318 in FIG. 1, an ILD planerization step 320 is performed during which the metal layer 360 is planerized until only metal pillars 362 and 363 remain embedded in ILD layer 326. This planerization process leaves metal pillars 362 and 363 and ILD layer 326.

After the metal planerization step 20 or ILD planerization step 320 in FIG. 1, a conductive metal-cap deposition step 22 is performed during which a conductive metal cap 108 is applied on top of the ILD layer 71 and metal pillars 72, 73 and 74. The conductive metal cap 108 allows for modular fabrication by sealing the non-volatile magnetic memory cell. The conductive metal cap 108 advantageously protects the pillars 72, 73 and 74 from oxidizing during transport by manufacturing the memory in multiple stages. For example, during the FEOL stage 15, the transistor 61 and non-magnetic portions of the memory cell 1 are manufactured and during to a magnetic fabrication stage 25, the magnetic material portion of the memory cell 1 is manufactured. During fabrication, a number of stages of manufacturing are performed. For example, in the embodiment related to and method of FIG. 1, there are three stages of fabrication shown. These stages include: FEOL 15, magnetic fabrication 25, and BEOL 35 stages. The FEOL 15 facility is the facility used to perform CMOS and/or non-magnetic metal fabrication. The BEOL 35 facility is the facility used to perform the subsequent metal fabrication. By allowing for transport (modularity of the processes), the need to have the FEOL 15, magnetic fabrication, and BEOL 35 processes in the same facility is eliminated. This allows for production in the least expensive CMOS factory without regard to the BEOL 35 wherein the FEOL 15 further enhances cost-effectiveness. Additionally, separating the FEOL 15 and the BEOL 35 in separate facilities further prevents contamination of the CMOS fabrication by the magnetic fabrication.

During magnetic fabrication 25 all the magnetic elements, namely the MTJ 74, are deposited and formed. In the present application, steps 10-22, and alternatively 314-320, comprise the FEOL 15. Steps 24-34 are included in the magnetic fabrication 25. Steps 36-46 are included in the BEOL 35. It should be noted that the use of FEOL 15, magnetic fabrication 25, and BEOL 35 are exemplary only. Further, it is contemplated that two or more of these stages may be combined into a single stage in the same fabrication facility.

The conductive metal cap 108 also provides a smoother surface for the MTJ 76 to be positioned thereon. A lower surface roughness allows for advantageously forming the MTJ, which results in a higher tunneling-magneto resistance (TMR). An exemplary average surface roughness (Ra) of the metal cap 108 is 10 angstroms or smoother. The metal cap 108 helps to control the surface roughness onto which the MTJ 76 is deposited. The conductive metal cap 108 also advantageously increases the height of the MTJ 76. This improves the CMP error threshold because less attention need be given to avoid over-planarization, which is a known problem with CMP methods. This leads to faster CMP thereby decreasing manufacturing time. That is, the conductive metal cap 108 advantageously raises the height of the MTJ 76 that is to be positioned thereon. This increases the CMP error threshold thereby increasing the reliability of manufacturing. Increased reliability in manufacturing allows for a better reliability (i.e. a higher percentage of working memory cells-per-wafer), thereby reducing the cost-per-element. The increase in speed also decreases fabrication time, increasing yield, thereby further decreasing overall cost.

In one embodiment of the present invention, the metal cap 108 is typically less than 500 Angstroms in its thickness. When compared with the thickness of metal pillar 72, the metal cap 108 is anywhere typically less than ¼th as thick.

In an exemplary application the conductive metal cap 108 is made of tantalum nitride (TaN), and has a resistivity of approximately 20 micro Ohms-centimeter. It should be noted that all resistance and thickness values for the conductive metal cap 108 and any other layer are merely exemplary and different resistance values and thicknesses are contemplated. It also should be noted that the use TaN as the cap layer is exemplary only and that other conductive metal materials are contemplated. These other conductive metal material are preferrably conductive and substantially non-reactive so as to avoid oxidation, and have a high melting point (e.g. greater than 1200 degrees Celcius), and have a resistivity less than 100 micro Ohms-cm, and a deposited film Ra of less than 20 Angstroms. If the deposited film Ra is higher than 20 Angstroms, but otherwise meets the criteria, it will be kiss-polished to less than 20 Angstroms. "Kiss-polish" refers to a very short or light polishing process without having much material removal (typically less than 10 nm of the underlying material) than the preceding polish. Examples of suitable materials include but are not limited to Tantalum, Chromium, Molybdenum, Tungsten, Niobium, Titanium, Zirconium, Vanadium and Ruthenium. In addition, the conductive metal cap 108 may be formed from any alloy that substantially meets the criteria. Also, mixtures containing less than 1% nitrides of a suitable material are also contemplated.

It should also be noted that use of a single layer of metal material metal cap 108 is exemplary only and it is contemplated that layers of different crystalline and amorphous metal materials may be formed together. In an exemplary application of a layered approach, copper nitride (CuN) and tantalum (Ta) may be layered together to reduce resistance and/or decrease the average roughness (Ra). However, other combinations of crystalline and amorphous materials may be used.

After the conductive metal-cap deposition step 22 in FIG. 1, a magnetic tunnel junction film (MTJ) deposition step 24 is performed during which the MTJ film 110 is layered on top of the conductive metal cap 108. The MTJ film 110 is layered onto the conductive metal cap 108 using a cluster tool. A cluster tool is a tool for applying varying materials without breaking vacuum. It is necessary here because of the various ways a MTJ can be formed. The following applications provide further details of various MTJs that can be used to comprise the memory cell 1, the disclosures of which are herein incorporated by reference as though set forth in full:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A high capacity low cost multi-state magnetic memory" by Ranjan et alia, U.S. application Ser. No. 11/739,648 Filed Apr. 24, 2007, titled "Non-volatile magnetic memory with low switching current and high thermal stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Mar. 26, 2007, titled "High capacity low cost multi-stacked cross-line magnetic memory" by Ranjan et alia, U.S. application Ser. No. 60/863,812, filed Nov. 1, 2006, titled "Novel spintronic device" by Wang, U.S. application Ser. No. 11/932,940 filed Oct. 31, 2007 titled "current-confined effect of magnetic nano-current-channel (NCC) for magnetic random access memory (MRAM)" by Wang, U.S. application Ser. No. 11/866,830 filed Oct. 3, 2007, titled "Improved high capacity low cost multi-state magnetic memory" by Ranjan et alia, and U.S. application Ser. No. 11/860,467 filed Sep. 24, 2007, titled "Low cost multi-state magnetic memory" by Ranjan et alia.

MTJs other than those disclosed in the patent documents above are contemplated. A conductive metal cap 112 is then formed on top of the MTJ film 110. The conductive metal cap 112 essentially serves as the top electrode of a memory element. In an exemplary embodiment, the conductive metal cap 112 is made of Ta. In another embodiment, the conductive metal cap 112 is approximately 40 nanometers in thickness.

After the MTJ deposition step 24 in FIG. 1, a photo resist step 26 is performed during which photo-resist pillars 114 are formed above metal pillars 72, 73 and 74, as is later shown in FIG. 11.

After the photo resist step 26 in FIG. 1, an MTJ etching step 28 is performed during which the conductive metal cap 112 and MTJ film 110 are partially etched leaving a pillar of conductive-metal pillar 78 and MTJ (or MTJ pillar) 76, as shown in FIG. 2. In an exemplary application, the MTJ etching step 28 is done in two stages. The first stage is a selective etching used to target the conductive metal cap 112. The second stage selectively etches the MTJ film 110. In an exemplary application, the first stage is accomplished using carbon tetrafluoride (CF4) and the second stage is accomplished using methanol (CH3OH) or carbon monoxide (CO)+ammonia (NH3) etching. It should be noted that the two-stage etching and use of CF4, CH3OH and CO+NH3 are exemplary only and the use of other gases are also contemplated. In addition, in an exemplary application, after etching the top electrode is approximately 20 to 60 nanometers thick.

After the MTJ etching step 28 in FIG. 1, a pillar passivation step 30 is performed during which the MTJ 76 and conductive metal pillar 78 are covered with a passivation layer 116 to protect the MTJ from oxidization and other damage during potential transport from the magnetic fabrication 25 to BEOL 35 facilities. In an exemplary application, the passivation layer 116 is formed using silicon nitride (Si3N4). Si3N4 is a dielectric material with excellent protective qualities. The use of Si3N4 is exemplary only and other materials that are non-conductive, have good adhesion, and a temperature deposition of below approximately 350 degrees Celsius are also contemplated. Other such materials include, but are not limited to, silicon nitride (SiN), silicon oxy-nitride (SiON), zirconium oxide (ZrO2), zirconium nitride (ZrN), hafnium oxide (HfO2), and hafnium nitride (HfN).

After the pillar passivation step 30 in FIG. 1, a photo resist step 32 is performed during which photo resist is applied over the passivation layer 116 as shown in FIG. 14. The photo resist area is substantially larger than the MTJ 76 and conductive metal cap 78. The larger size is to advantageously avoid redeposition during etching. Redeposition is a process whereby material from one area is moved to another during etching. Redeposition affects memory cell 1 reliability and yield. In addition, a larger etching area allows for greater variation in MTJ 74 placement. A larger variation in MTJ placement reduces the number of non-functioning memory cells by assuring an electrical connection and reduces the number of quality assurance steps.

After the photo resist step 32 in FIG. 1, a MTJ etch step 34 is performed during which the passivation layer 116 and conductive metal cap 108 is etched away except in the over-sized area substantially above the MTJ 76 and conductive metal pillar 78, leaving conductive metal pillar 74, MTJ 76, conductive metal pillar 78, and passivation cap 80.

The passivation cap 80 is typically made of oxide and nitrides of transition metals which are readily available for high volume Integrated Circuit (IC) manufacturing. Examples of materials that the passivation cap 80 is made of include, but are not limited to, silicon nitride (Si3N4), silicon nitride (SiN), silicon oxy-nitride (SiON), zirconium oxide (ZrO2), zirconium nitride (ZrN), hafnium oxide (HfO2), hafnium nitride (HfN), tantalum nitride (TaN), titanium nitride (TiN), tantalum oxide (Ta2O5), aluminum oxide (Al2O3), or aluminum nitride (AlN). The passivation cap 80 is the passivation layer 116 after the latter has been patterned.

After etching the MTJ is substantially oval in shape with a Length/Depth ratio (L/D ratio) ranging from 1 to 3. This L/D ratio is achieved during the etching process by selective application of the photo-resist mask. Unlike other etching applications, there is generally no use of optical pattern correction (OPC). OPC is commonly used to maintain a substantially square edge during etching. However, it is desirable to have an oval shape for the MTJ to decrease switching current which may require some unique OPC depending upon the resulting shape and size of the etched pillar as well as the process conditions. In an exemplary application, RIE with an etch rate of greater than 0.1 Angstroms/sec is used to etch the passivation layer 116. Specifically, gases are used which have a substantially gaseous by-product and the by-products are vacuumed away during etching. RIE with gaseous by-products advantageously reduces the number of steps by eliminating the need for a cleaning step. In addition, RIE with a substantially gaseous by-product produces less re-deposition, which advantageously increases reliability, as discussed above. For example, carbon monoxide (CO) may be used to etch the MTJ. It should be noted, however that the use of RIE with gaseous by-products is exemplary only and other forms of etching are contemplated. Other forms of RIE may be used such as a chlorine etching. In addition, ion milling (also "ion bombardment") may be used to etch the passivation layer 116. However, ion milling causes significant redeposition and requires additional clean-up steps.

After the MTJ etch step 34 in FIG. 1, an ILD deposition and planerization step 36 is performed during which an ILD layer 118 is deposited on ILD layer 71 and metal pillars 72, 74 and 73. In an exemplary application, the ILD layer 118 is silicon oxide ($SiO_2$) but it should be noted that other materials are contemplated Referring now to FIGS. 2i-2l, showing the stages of the CMP process in step 36 to include a plurality of stages. After the ILD layer 118 is deposited, ILD layer 118 is planerized using CMP until substantially the top of the conductive metal pillar 78 is exposed.

Figure 2I:
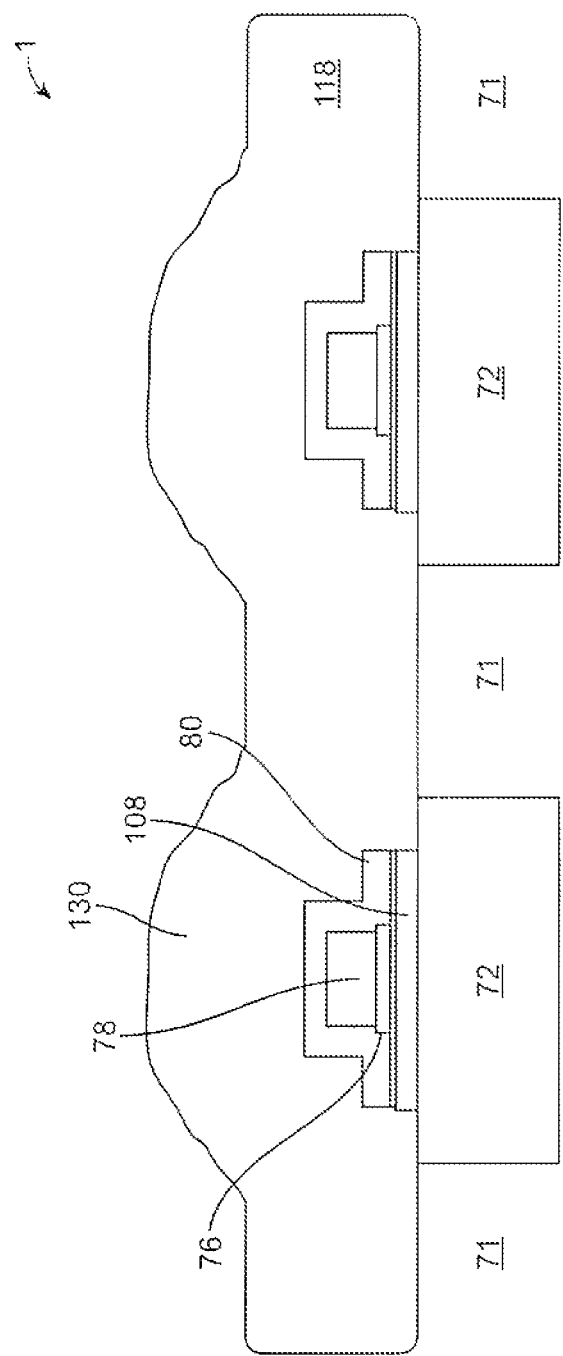

Referring now to FIG. 2i, showing a cross section of the wafer to include ILD layer 71, metal pillar 72, conductive metal cap 74, MTJ 76, conductive metal cap 76, passivation layer 116, and ILD layer 118. FIG. 2i shows a small hump 130 over the MTJ 76.

Referring now to FIGS. 2i and 2j, the small hump 130 that forms above the MTJ 76 as part of the deposition process is flattened using CMP so that the ILD layer 118 is flat.

Figure 2K:
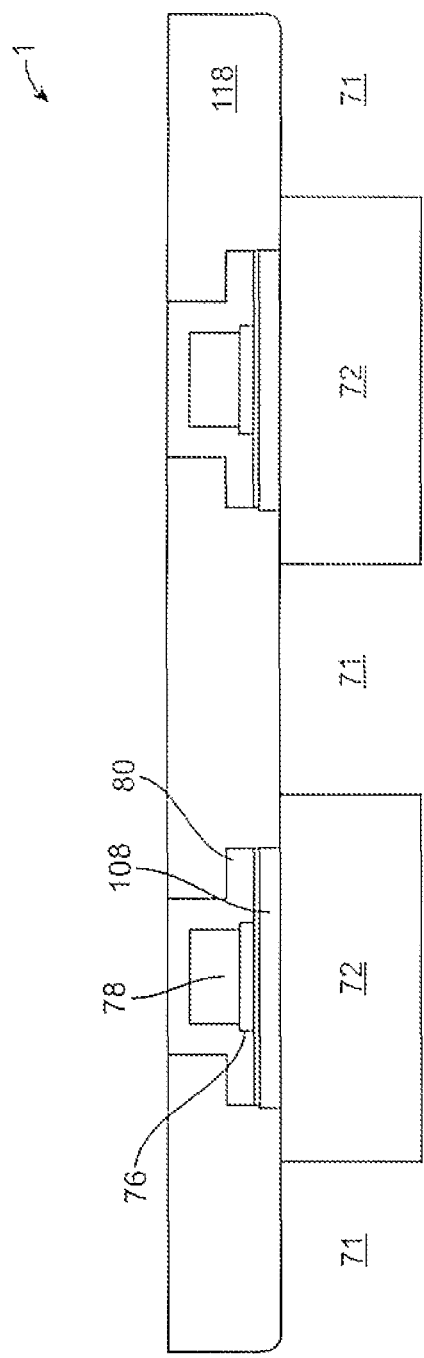
Figure 2I:
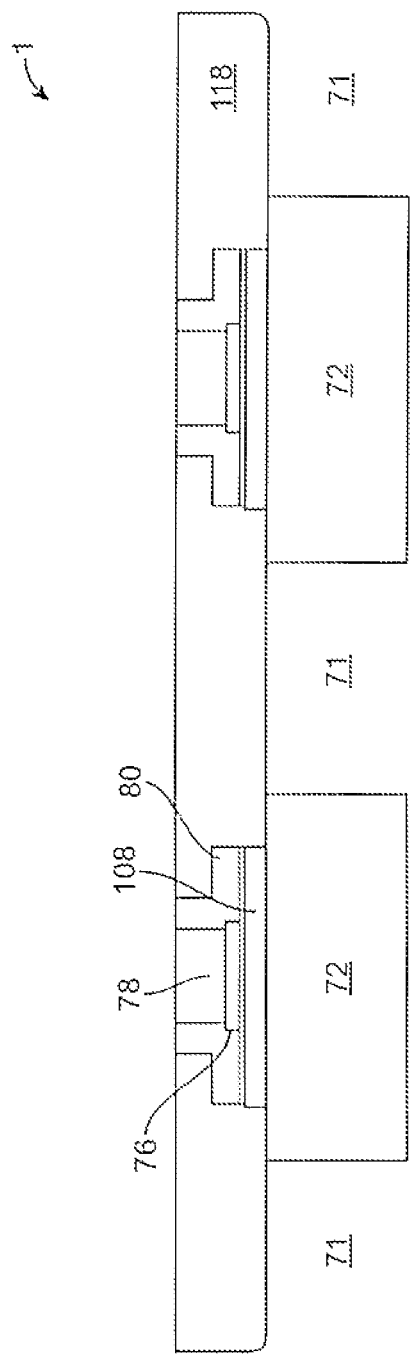

Referring now to FIG. 2k, the ILD layer 118 is planerized using CMP until the top of the passivation cap 80 is exposed. Passivation cap 80 results from the patterning of the passivation layer 16.

Referring now to FIG. 2*l*, the CMP slurry is changed and the passivation cap 80 is planerized using CMP until the top of conductive metal pillar 78 is exposed.

After the ILD deposition and planerization step 36 in FIG. 1, a metal deposition step 38 is performed during which a metal layer 120 is deposited on top of the ILD layer 118 and MTJ-stack top 77. In an exemplary application, aluminum is used for this step. It should be noted that other metals are also contemplated.

After the metal deposition step 38 in FIG. 1, a photo resist step 40 is performed during which photo resist 121 is patterned into bars on top of the metal cap 120 as shown in FIG. 18.

After the photo resist step 40 in FIG. 1, a metal etching step 42 is performed during which the metal cap 120 is etched away leaving metal bars 122. The metal bars connect multiple conductive metal caps 78 in order to pass a current and read from and write to the non-volatile magnetic memory cell. In an exemplary application, RIE is used to etch the metal bars 122. It should be noted that the use of RIE is exemplary only and other forms of etching are contemplated.

After the metal etching step 42 in FIG. 1, a passivation step 44 is performed during which a passivation layer 124 is deposited encapsulating the metal bars 122. The passivation layer 124 is necessary to prevent undesirable electrical connections between electrical components.

After the passivation step 44 in FIG. 1, a contact pads step 46 is performed during which contact pads are opened up to the memory cell 1 allowing the memory cells to connect to the rest of the circuits and logic.

FIGS. 3-21 show 3-dimensional views of the relevant part of a wafer 306 onto which memory cells are formed in accordance with the method of FIG. 1. Each figure shows six memory cells.

Figure 3:
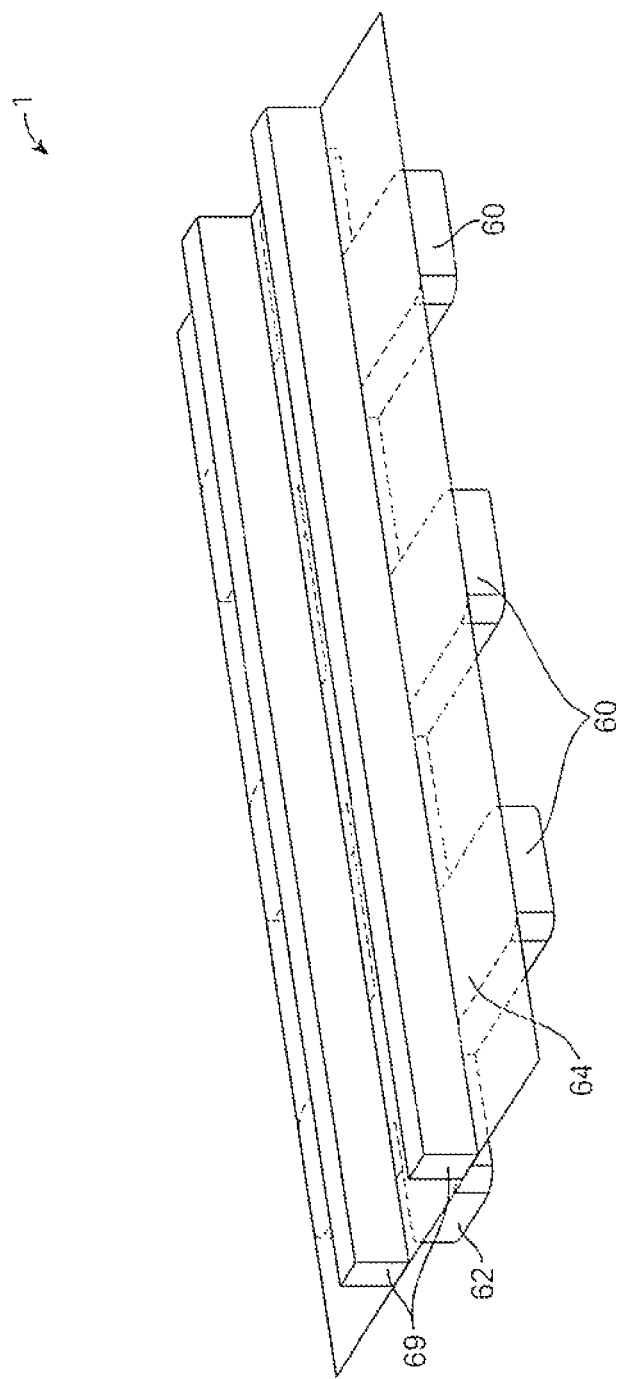
FIGS. 3-23 show 3-dimensional views of the relevant part of a wafer onto which memory cells are formed in accordance with the method of FIG. 1.

Referring now to FIG. 3 which shows the structure of the memory cell 1 after the CMOS step 10 has been completed, the source 60 and drain 62 are shown to be formed substantially parallel to one another. The gate 69 is shown to be form substantially on top of the source 60, drain 62, and the channel 64 is formed substantially underneath the gate.

Figure 3A:
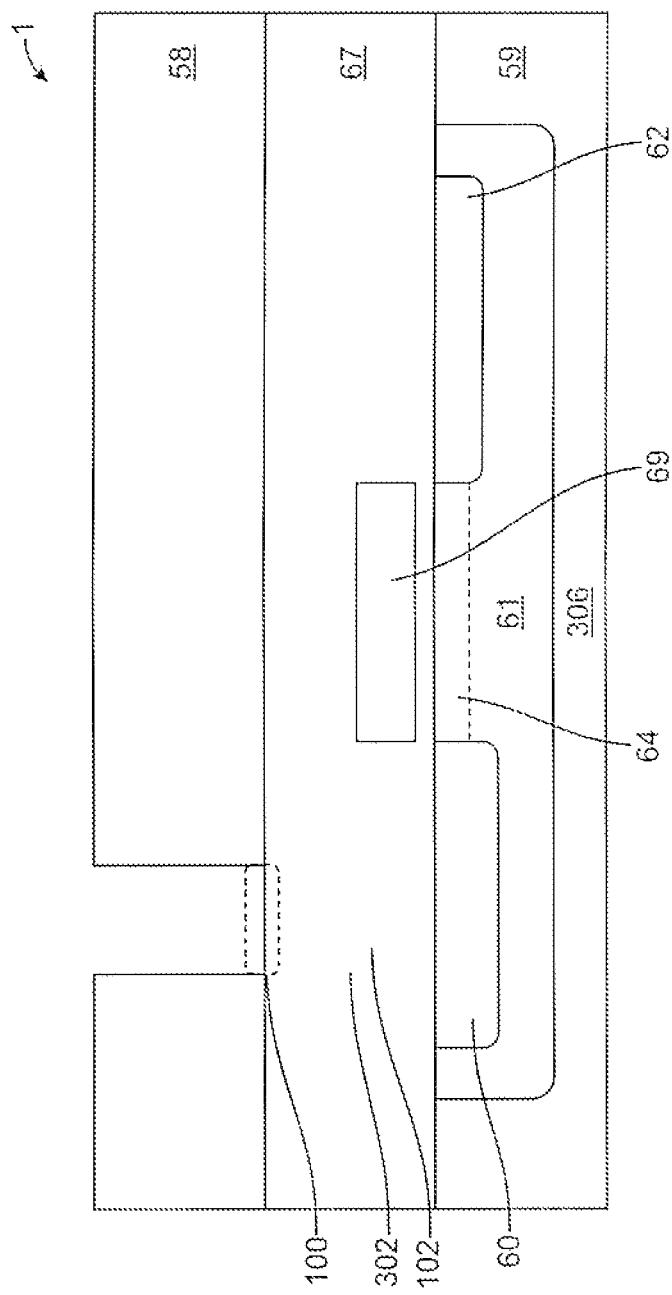
FIG. 3a shows the structure of the memory cell during step 12, after photo resist has been applied to the top of the ILD layer except in the contact definition area.
Figure 3B:
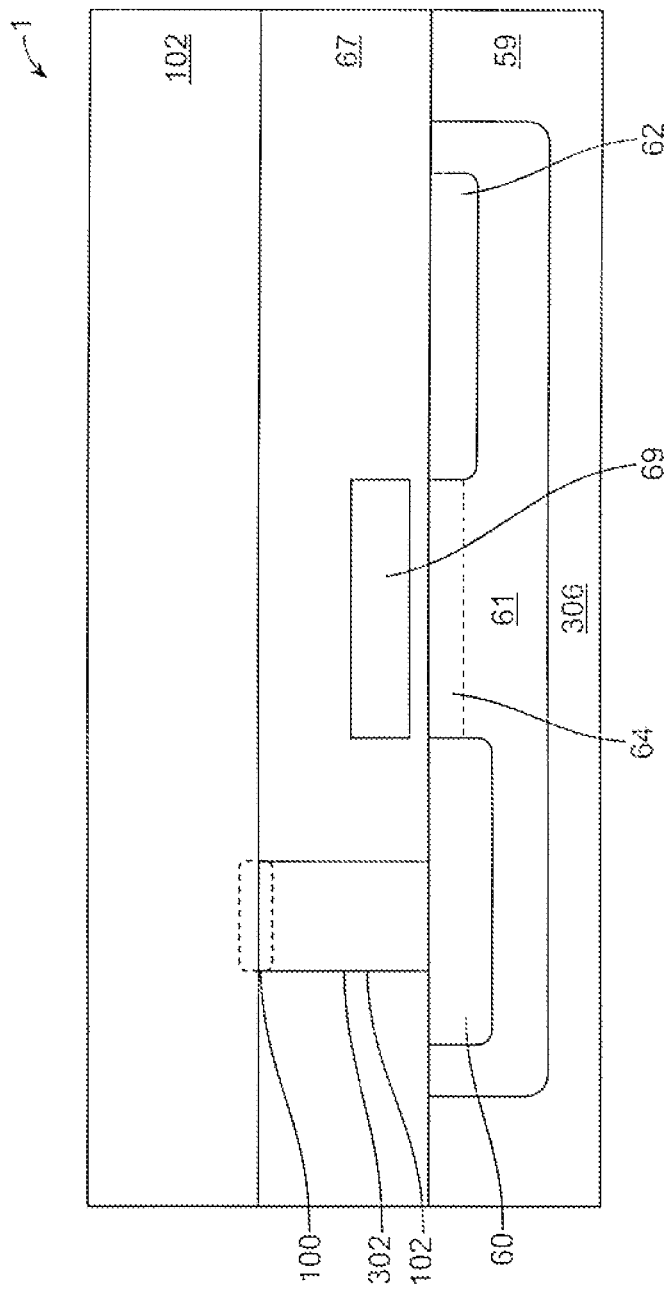
FIG. 3b shows the structure of the memory cell during step 12, after the ILD layer has been etched and a metal material deposited on top of the ILD layer.

FIGS. 3*a* and 3*b* show the structure of memory cell 1 after the contact definition step 12. In FIG. 3*a*, the photo-resist 58 is shown to be patterned on top of the ILD layer 67 except in the contact area 100, as noted above. In FIG. 3*b*, the barrier layer 101 is shown to fill the hole 302. The barrier layer 101 is formed on top of the ILD layer 67 as well as in the hole 302.

Figure 4:
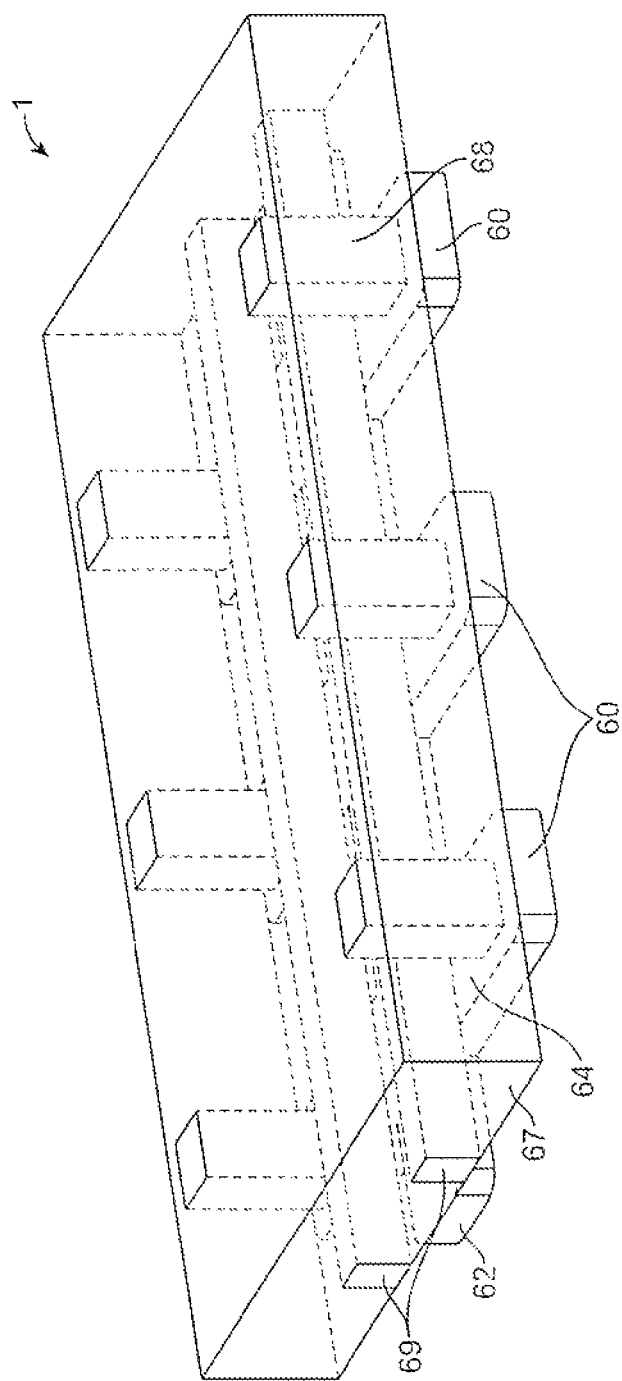

FIG. 4 shows the structure of the memory cell 1 after the step 12. The memory cell 1 is shown to include the drain 62, source 60, channel 64, gate 69, ILD layer 67 and metal contact pillar 68. The metal contact pillar 68 is shown formed substantially on top of the source 60. The ILD layer 67 is shown formed substantially around the metal pillar 68 and of substantially the same thickness as the metal pillar 68.

Figure 5:
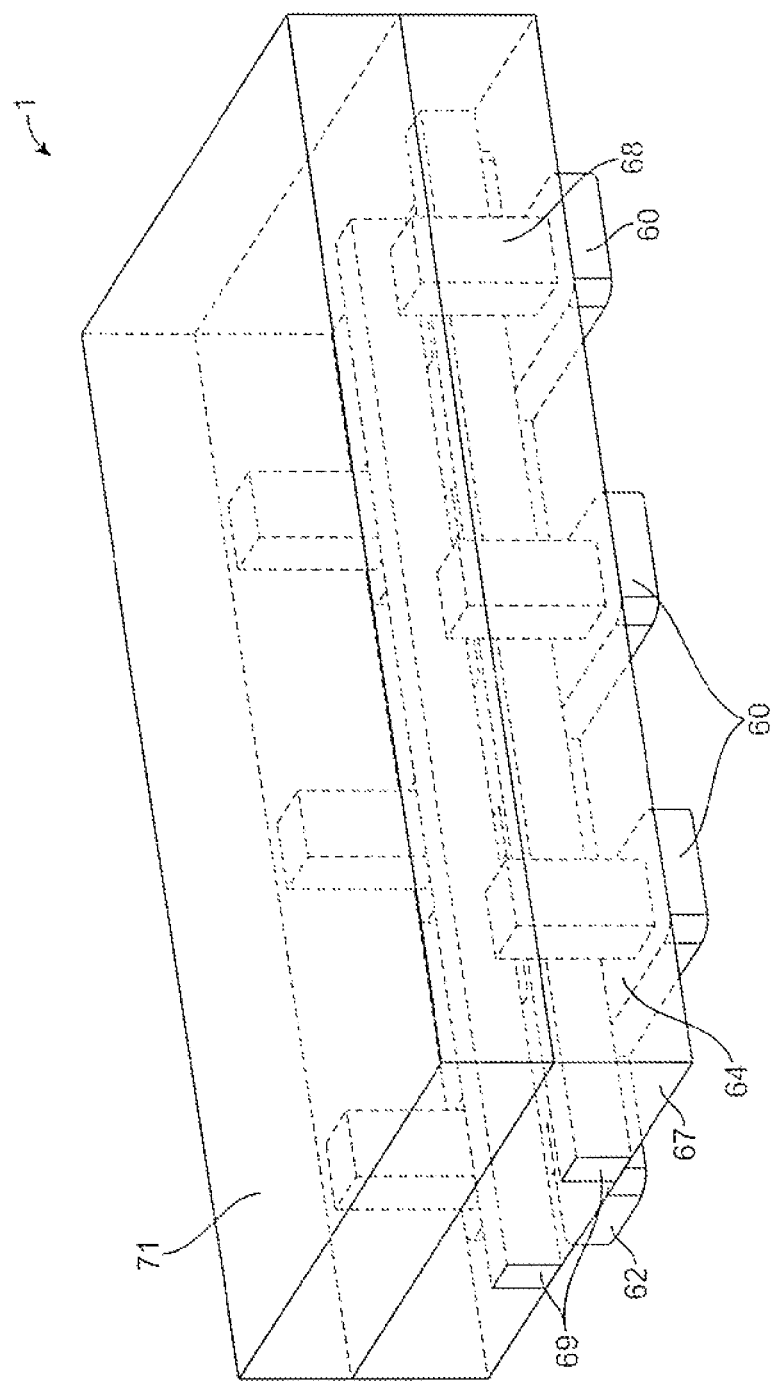
Figure 5A:
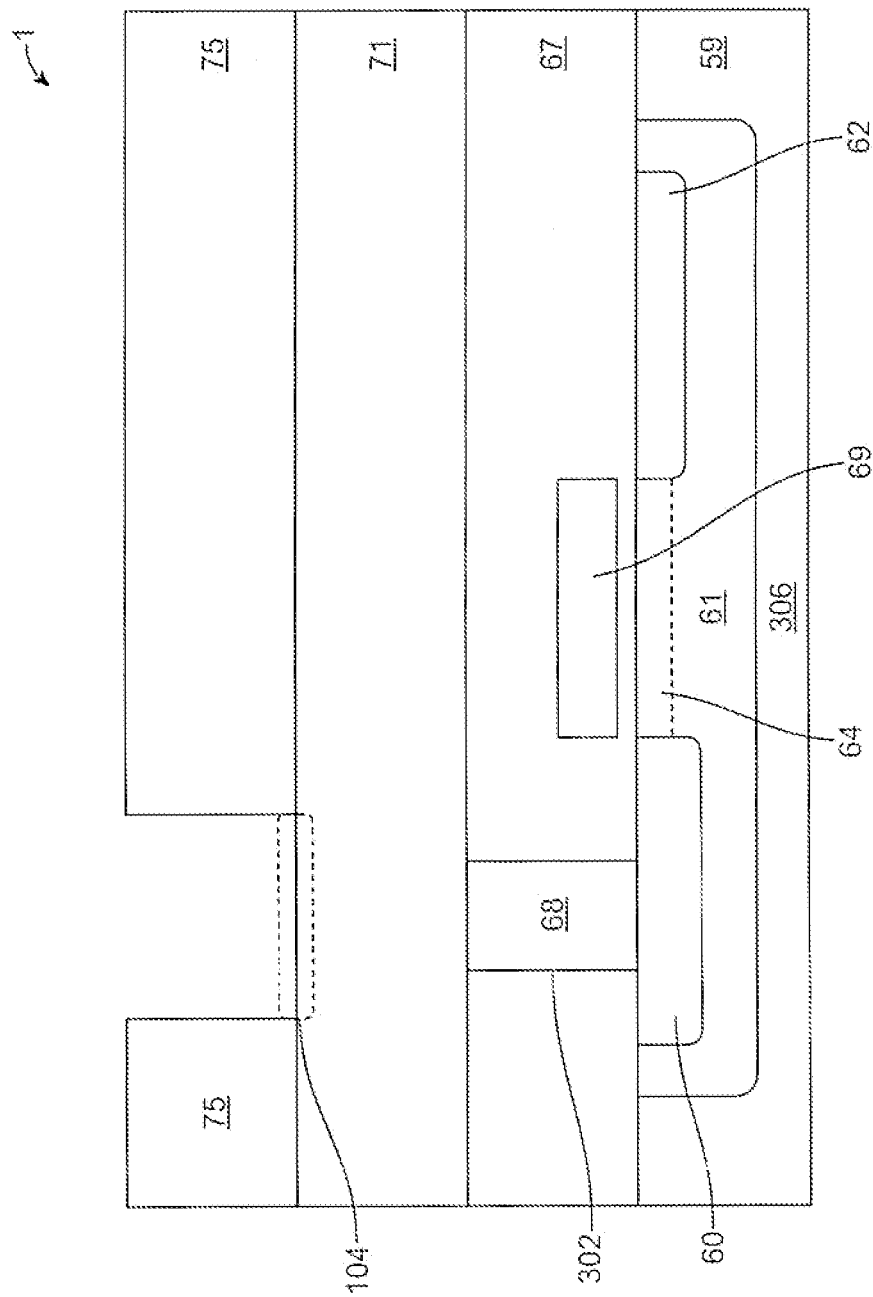
FIG. 5a shows the structure of the memory cell during step 16 where photo resist has been applied to the top of the ILD layer except over the contact definition area.

FIGS. 5 and 5*a* show the structure of the memory cell 1 after the step 14. In FIG. 5, the memory cell 1 is shown to include the drain 62, source 60, channel 64, gate 69, ILD layer 67, metal contact pillar 68, and ILD layer 71. The ILD layer 71 is shown formed substantially over the ILD layer 67 and metal contact pillar 68. In FIG. 5*a*, the memory cell 1 is shown when photo-resist 75 is applied on top of the ILD layer 71.

Figure 6:
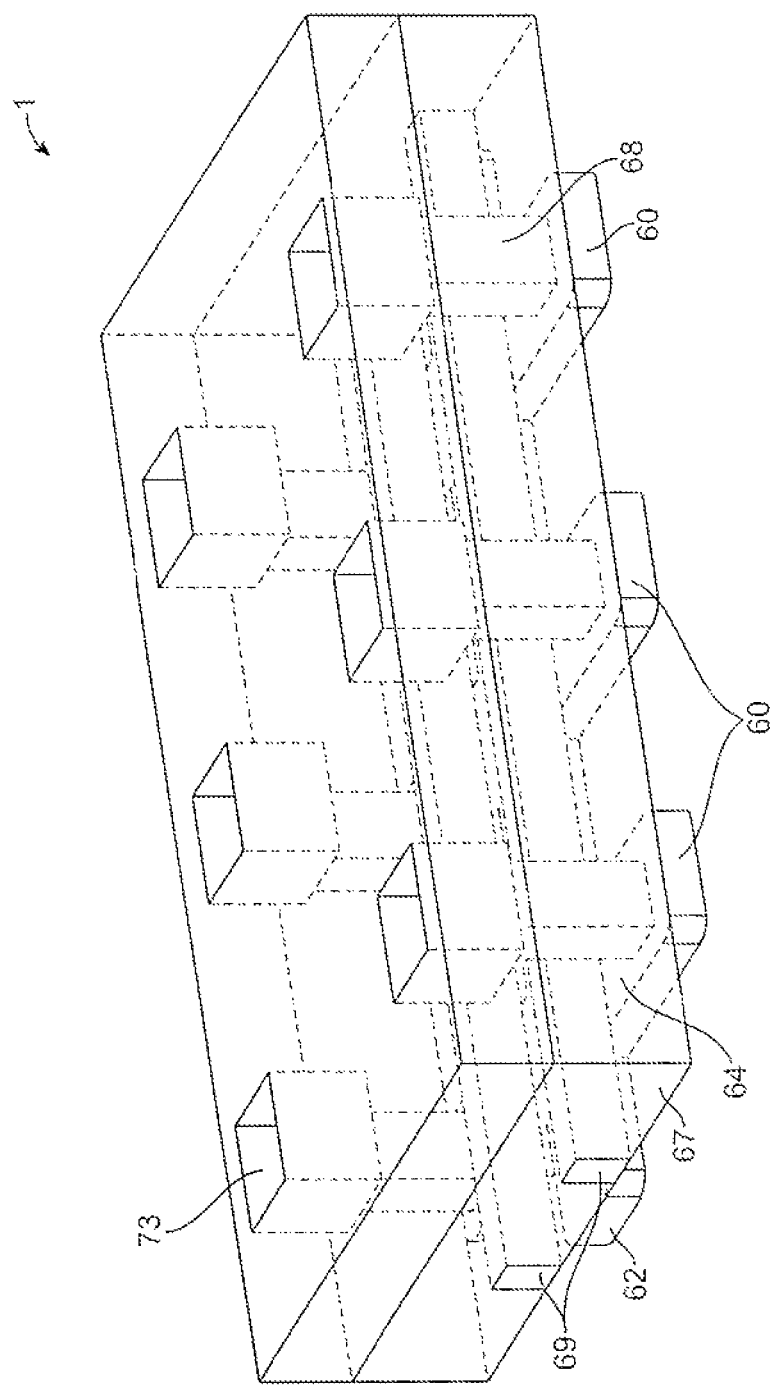

FIG. 6 shows the structure of the memory cell 1 after the step 16. The memory cell 1 is shown to include the drain 62, source 60, channel 64, gate 69, ILD layer 67, metal contact pillar 68, and a post-etch ILD layer with pillar holes 73. The post-etch ILD layer with pillar holes 73 is shown formed above the ILD layer 67 and metal contact pillar 68.

FIG. 7 shows the structure of the memory cell 1 after the step 18. The memory cell 1 is shown to the drain 62, source 60, channel 64, gate 69, ILD layer 67, metal contact pillar 68, post-etch ILD layer with pillar holes 73, and metal material 106. The metal material is formed above the post-etch ILD layer with pillar hole 73. The metal material is also formed in such a way as to fill the pillar holes in the post-etch ILD layer will pillar holes.

FIG. 8 shows the structure of the memory cell 1 after the step 20. The memory cell 1 is shown to include the drain 62, source 60, channel 64, gate 69, ILD layer 67, metal contact pillar 68, ILD layer 71, and metal pillar 72. The metal pillar 72 is shown to be formed substantially above metal contact pillar 68 so as to make electrical contact. ILD layer 71 is shown formed around metal pillar 72 and formed of substantially the same thickness as metal pillar 72.

FIG. 9 shows the structure of the memory cell 1 after the step 22. The memory cell 1 is shown to include the drain 62, source 60, channel 64, gate 69, ILD layer 67, metal contact pillar 68, ILD layer 71, metal pillar 72, and conductive metal cap 108. The conductive metal cap 108 is shown formed substantially above the ILD layer 71 and metal pillar 72.

FIG. 10 shows the structure of the memory cell 1 after the step 24. The memory cell 1 is shown to include the drain 62, source 60, channel 64, gate 69, ILD layer 67, metal contact pillar 68, ILD layer 71, metal pillar 72, conductive metal cap 108, MTJ film 110, and conductive metal cap 112. The MTJ film is shown formed substantially on top of the conductive metal cap 108. The conductive metal cap 112 is shown formed substantially on top of the MTJ film 110.

FIG. 11 shows the structure of the memory cell 1 after the step 26. The memory cell 1 is shown to include the drain 62, source 60, channel 64, gate 69, ILD layer 67, metal contact pillar 68, ILD layer 71, metal pillar 72, conductive metal cap 108, MTJ film 110, conductive metal cap 112 and photo-resist pillars 114. The photo-resist pillars are shown formed on top of the conductive metal cap 112 and are positioned substantially in line with the metal pillar 72 along the vertical axis FIG. 12 shows the structure of the memory cell 1 after the step 26. The memory cell 1 is shown to include drain 62, source 60, and resistor 64, ILD layer 67, metal contact pillar 68, ILD layer 71, metal pillar 72, conductive metal cap 108, MTJ 76, and conductive metal pillar 78. While in FIG. 12, the MTJ 76 and conductive metal pillars are shown as square in shape, other shapes, including but not limited to, circles and ovals are also contemplated. Non-square shapes prove advantageous because they decrease the current required to operate the non-volatile magnetic memory cell.

FIG. 13 shows the structure of the memory cell 1 after the step 28. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, and passivation layer 116. The cap area is raised in the area substantially above the conductive metal pillar 78.

FIG. 14 shows the structure of the memory cell 1 after the step 32. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, Si3N4 layer 116, and photo resist pillars 117. The photo resist is formed substantially above the MTJ 76 and conductive metal pillar 78.

FIG. 15 shows the structure of the memory cell 1 after the step 34. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, and passivation cap

80. The passivation cap 80 substantially encapsulates the conductive metal cap 74, MTJ 76, and conductive metal pillar 78.

FIG. 16 shows the structure of the memory cell 1 after the step 36. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, and ILD layer 118. The ILD layer 118 is then planerized using CMP to expose the MTJ-stack top 77.

FIG. 17 shows the structure of the memory cell 1 after the step 38. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, and the metal cap 120. The metal cap is formed substantially on top of the ILD layer 118.

FIG. 18 shows the structure of the memory cell 1 after the step 40. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, a metal cap 120, and a photo resist bars 121. The photo resist bars are formed on top of the metal cap 120 and substantially above the conductive metal caps 78.

FIG. 19 shows the structure of the memory cell 1 after the step 42. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, and metal bars 122. The metal bars are formed substantially above the conductive metal pillar 78 and connect multiple memory cells in order to pass current and operate them.

FIG. 20 shows the structure of the memory cell 1 after the step 44. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, metal bars 122, and a passivation layer 124. The passivation layer is formed substantially on top of the metal bars 122 and ILD layer 118.

FIG. 21 shows the structure of the memory cell 398 after step 314. The memory cell 398 is shown to include the drain 62, source, 62, resistor 64, ILD layer 67, metal contact pillar 68, and metal layer 322. In an exemplary embodiment the metal layer 322 is made out of copper. It should be noted that this is exemplary only and other materials are contemplated.

FIG. 22 shows the structure of the memory cell 398 after step 316. The memory cell 398 is shown to include the drain 62, source, 62, resistor 64, ILD layer 67, metal contact pillar 68, and metal pillars 72.

FIG. 23 shows the structure of the memory cell 398 after steps 318 and 320. The memory cell 398 is shown to include the drain 62, source, 62, resistor 64, ILD layer 67, metal contact pillar 68, ILD layer 71 and metal pillars 72. Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a magnetic random access memory (MRAM) cell comprising performing a front end on-line (FEOL) stage, in a first facility, to make logic and non-magnetic portions of a memory cell being manufactured including the steps of, forming an intermediate interlayer dielectric (ILD) layer in the first facility;

forming intermediate metal pillars embedded in the intermediate ILD layer in the first facility; and depositing a conductive metal cap on top of the intermediate ILD layer and the metal pillars to seal the intermediate ILD layer and the intermediate metal pillars, wherein after the depositing step, a FEOL stage structure is formed;

performing magnetic fabrication stage, in a second facility separate and apart from the first facility, to make a magnetic material portion of the memory cell being manufactured; and performing back end on-line (BEOL) stage, in the second facility to make metal and contacts of the memory cell being manufactured.

2. A method of manufacturing, as recited in claim 1, wherein the FEOL stage further includes the steps of: forming logic on top of a wafer, onto which memory cells are to be formed;

forming a first ILD layer on top of the logic; and forming a plurality of first metal pillars dispersed in the first ILD layer.

3. A method of constructing a MRAM memory cell, as recited in claim 2, where the first metal pillars are made of tungsten.

4. A method of constructing a MRAM memory cell, as recited in claim 2, where the intermediate ILD layer is formed using a damascene process comprising:

forming a intermediate ILD layer on top of the first ILD layer and first metal pillars;

depositing photo resist on top of the intermediate ILD layer in a manner which covers substantially all of the ILD layer except the portion above the first metal pillars;

etching the intermediate ILD layer until the first metal pillars are exposed;

depositing a metal layer until the metal contacts the exposed, first metal pillars;

planerizing the metal leaving in place the second metal pillars.

5. A method of constructing a MRAM memory cell, as recited in claim 4, where the second metal pillars are formed from copper.

6. A method of constructing a MRAM memory cell, as recited in claim 1, where the intermediate ILD layer etching is done using reactive ion etching (RIE).

7. A method of constructing a MRAM memory cell, as recited in claim 2, where the intermediate ILD layer is formed using a non-damascene process comprising:

depositing a metal layer on top of the first ILD layer and first metal pillars;

depositing photo-resist pillars on top of the metal layer in a pattern substantially above the first metal pillars;

etching the metal layer until the second metal pillars remain;

depositing an ILD layer covering the entire wafer including the second metal pillars;

planerizing the ILD layer until the tops of the second metal pillars are exposed.

8. A method of constructing a MRAM memory cell, as recited in claim 2, where the second metal pillars are formed of copper.

9. A method of constructing a MRAM memory cell, as recited in claim 2, where the metal layer etching is done using reactive ion etching (RIE).

10. A method of constructing a MRAM memory cell, as recited in claim 2, where the first conductive metal cap is made of Tantalum, Tantalum Nitride, Titanium, Titanium Nitride, Chromium, Tungsten, Niobium or alloys containing one or more of these elements.

* * * * *